(12) United States Patent
Tanaka et al.

(10) Patent No.: US 6,249,145 B1
(45) Date of Patent: Jun. 19, 2001

(54) LEVEL CONVERSION CIRCUIT AND SEMICONDUCTOR INTEGRATED CIRCUIT DEVICE EMPLOYING THE LEVEL CONVERSION CIRCUIT

(75) Inventors: Kazuo Tanaka, Tokyo; Hiroyuki Mizuno, Kokubunji; Rie Nishiyama, Akishima; Manabu Miyamoto, Kodaira, all of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/209,755

(22) Filed: Dec. 11, 1998

(30) Foreign Application Priority Data

Dec. 26, 1997 (JP) .................................................. 9-359273

(51) Int. Cl.[7] ............................................. H03K 19/0175
(52) U.S. Cl. ................................. 326/68; 326/68; 326/62; 326/63
(58) Field of Search ................................. 326/63, 68, 80, 326/81, 112, 119, 121, 104, 108; 257/903, 369

(56) References Cited

U.S. PATENT DOCUMENTS

| 5,559,996 | * | 9/1996 | Fujioka | 395/500 |
| 5,576,639 | | 11/1996 | Park . | |
| 5,659,258 | * | 8/1997 | Tanabe et al. | 326/68 |
| 5,666,070 | * | 9/1997 | Merritt et al. | 326/81 |
| 5,939,762 | * | 8/1999 | Lien | 257/391 |
| 5,952,847 | * | 9/1999 | Plants et al. | 326/80 |

FOREIGN PATENT DOCUMENTS

| 0 334 050 | | 9/1989 | (EP) . |
| 4-150222 | * | 5/1992 | (JP) . |
| 4-268818 | | 9/1992 | (JP) . |

* cited by examiner

Primary Examiner—Michael Tokar
Assistant Examiner—Vibol Tan
(74) Attorney, Agent, or Firm—Mattingly, Stanger & Malur, P.C.

(57) ABSTRACT

In a level conversion circuit mounted in an integrated circuit device using a plurality of high- and low-voltage power supplies, the input to the differential inputs are provided. In a level-down circuit, MOS transistors that are not supplied with 3.3 V between the gate and drain and between the gate and source use a thin oxide layer. In a level-up circuit, a logic operation function is provided.

34 Claims, 27 Drawing Sheets

LEVEL CONVERSION CIRCUIT AND SEMICONDUCTOR INTEGRATED CIRCUIT DEVICE EMPLOYING THE LEVEL CONVERSION CIRCUIT

BACKGROUND OF THE INVENTION

1. Field of the Invention

The present invention relates generally to semiconductor integrated circuit devices and level conversion circuits, and more particularly, to semiconductor integrated circuit devices in which a plurality of circuit units driven by a plurality of different power supply voltages are formed on a single substrate, and to level conversion circuits used in the semiconductor integrated circuit devices.

2. Description of the Related Art

The trend in manufacturing semiconductor integrated circuit devices (such as large-scale integrated circuit devices) is to use lower power supply voltages to reduce power consumption. Recent integrated circuit devices are driven by 1.2 V power supplies, even though input/output units (I/O units), the interfaces with circuits driven by an external 3.3 V power supply, are also driven by a 3.3 V power supply.

Additionally, a single semiconductor chip may have two or more circuit blocks that are driven by different respective supply voltages. Such circuit blocks require level conversion circuits for raising or lowering voltage levels between circuit blocks having different respective supply voltages. FIG. 1(a) schematically illustrates a circuit diagram of a conventional level-down circuit (a circuit for converting a large-amplitude signal output by a circuit block operating on a 3.3 V power supply, for example, into a small-amplitude signal for input to a circuit block operating on a 1.2 V power supply, for example), and FIG. 2(a) schematically illustrates a conventional level-up circuit (a circuit for converting a small-amplitude signal output by a circuit block operating on a 1.2 V power supply, for example, into a large-amplitude signal for input to a circuit block operating on a 3.3 V power supply, for example).

In FIG. 1(a), VDDQ represents a 3.3 V input, VDD is a 1.2 V power supply, and VSS a reference, or ground, potential. Thus, VDDQ is a large-amplitude signal, and the output is a small-amplitude signal based upon the VDD potential.

In FIG. 1(a), a P-type MOS (PMOS) transistor 200 and an N-type MOS (NMOS) transistor 201 are shown, connected to receive on their respective gates an input IN0 having an amplitude of 0.0 V when low and 3.3 V when high, for example. IN0 is thus considered to be a large-amplitude signal input. The circuit shown in FIG. 1(a) outputs a small-amplitude signal out0 having an output value of 1.2 V, for example, based upon the power supply VDD. FIG. 1(b) illustrates the respective waveforms of IN0 and out0.

Since, in the PMOS transistor 200 and NMOS transistor 201, a maximum voltage of 3.3 V may be applied between gate and source, PMOS transistor 200 and NMOS transistor 201 are formed with a thick gate oxide layer.

In FIG. 2(a), the level-up circuit is constituted by PMOS transistors 202, 203 and NMOS transistors 204, 205. Small-amplitude amplitude input signals in0 and in0b are complementary dual rail signals. Output signal OUT0 is a large-amplitude output signal of, for example, 3.3 V, based upon power supply VDDQ. MOS transistors 202–205 each have a thick gate oxide layer similar to that of the MOS transistors 200, 201 of FIG. 1(a). FIG. 2(b) illustrates the respective waveforms of input signals in0, in0b and output signal OUT0.

In a conventional level-down circuit such as that shown in FIG. 1(a), the logic threshold is typically VDD/2, or close to 0.6 V. Large-amplitude input signals, because their amplitudes are relatively large, generally tend to produce noise of a type such that the ground level fluctuates. When the ground level fluctuates more than 0.6 V, the signal is judged erroneously to be a high level in the circuit of FIG. 1(a), resulting in a low-level output at out0. Hence, in the conventional level-down circuit, as the VDD supply decreases in voltage, the logic threshold becomes lower, and an incorrect logic value may be produced at the output out0 in the presence of even very small noise.

In the level-up circuit of FIG. 2(a), when the VDDQ power supply is on but the input power VDD is off, the values of in0 and in0b are undefined, causing a through-current to flow between VDDQ and VSS. Hence, in a system where VDD is produced from VDDQ by a DC-DC converter, a heavy load is exerted on the VDDQ power supply, causing a phenomenon, in which the VDD power supply cannot be turned on. If the VDD power supply cannot be turned on, in0 and in0b remain undefined, leaving the system permanently unable to start normally.

Not only when the power is turned on, but while the VDDQ power supply is on, it is impossible to cut off the VDD power supply because the cutoff of the VDD power renders the values of in0 and in0b undefined, causing a through-current to flow through the VDDQ and resulting in a significant increase in power consumption by the system.

Furthermore, the conventional input/output circuit unit that includes an output buffer circuit unit also has a similar problem to that discussed above with respect to the level conversion circuit unit. When the VDDQ power supply is turned on but the VDD power is not, the input signal value of the output buffer of the input/output circuit becomes undefined, causing a through-current to flow between VDDQ and VSS of the output buffer circuit.

SUMMARY OF THE INVENTION

An object of this invention is to provide a level-down circuit that does not readily produce an erroneous output in the presence of ground level fluctuation in large-amplitude input signals, and to provide a semiconductor integrated circuit device employing the level-down circuit.

Another object of this invention is to provide a level conversion circuit in which no through-current flows between a high-voltage power supply and a ground power supply, and to provide a semiconductor integrated circuit device employing the level conversion circuit, even when the high-voltage power supply is turned on but the low-voltage power is not.

Another object of the present invention is to provide a semiconductor integrated circuit device including a plurality of circuit blocks powered by different respective supply voltage levels, and level conversion circuits according to the invention for translating voltage levels between the various circuit blocks.

To achieve these and other objects of the invention, and to solve problems of the prior art, the present invention includes one or more of the following features in the various embodiments discussed in greater detail below:

(1) The input to a level-down circuit is provided differentially;

(2) In the level-down circuit, MOS transistors that do not receive 3.3 V between gate and drain or between gate and source have thin gate oxide layers;

(3) A level-up circuit has a logical operation function; and (4) An output buffer circuit provided with a level-up circuit includes means preventing a through-current from flowing through the output buffer when only one of the MOS transistors of the output buffer is turned on.

DETAILED DESCRIPTION OF THE PREFERRED EMBODIMENTS

In the following description, insulated gate field-effect transistors (FETs) and metal-insulator semiconductor FETs represented by the metal oxide semiconductor FET (MOSFET) are referred to simply as MOS transistors. An N-channel MOS transistor whose majority carriers are electrons is referred to as an NMOS transistor, and a P-channel MOS transistor whose majority carriers are holes is referred to as a PMOS transistor.

A "threshold voltage" (Vth) qualitatively denotes the voltage difference between the gate and the source when the drain current starts to flow. Quantitatively, a measured threshold voltage can be obtained by plotting several points in a MOS transistor saturated region in which the drain current is expressed by the square curve of the difference between the gate-source voltage and the threshold voltage. The threshold voltage depends on certain parameters, such as the concentration in the semiconductor substrate surface where an inversion channel is induced and the thickness of the gate insulating layer. Where comparisons of magnitudes of threshold voltage values are made in the following embodiments, it should be understood that both PMOS transistors and NMOS transistors operate in enhancement mode, and their threshold voltage values are compared as absolute values. If process parameters that determine the channel conductance β are the same, a MOS transistor having a greater drain current for the same gate-source voltage may be considered to have a lower threshold voltage, assuming that the channel width W and the channel length L are the same.

Although the source and drain of a MOS transistor are determined essentially by the bias of the circuit, in the accompanying drawings, the source of a PMOS transistor is labeled by an arrow pointing toward the gate electrode, and that of an NMOS transistor with an arrow pointing away from the gate electrode. An electrode whose bias direction changes during operation (such as a transmission gate) is labeled by a bi-directional arrow. When the source and drain are generally noted without any distinction, they are called source-drains.

In many integrated circuits, the gates and source-drains of MOS transistors that need large conductances are often commonly connected (the current paths between the sources and drains are connected in parallel) or are distributed equivalently in many cases. In this specification, such MOS transistors are represented by a single MOS transistor unless otherwise specifically stated. Likewise, where a plurality of MOS transistors have current paths between source and drain connected in series and gates applied with the same signal, such MOS transistors are represented by a single MOS transistor in this specification unless otherwise stated.

Figure 3A:
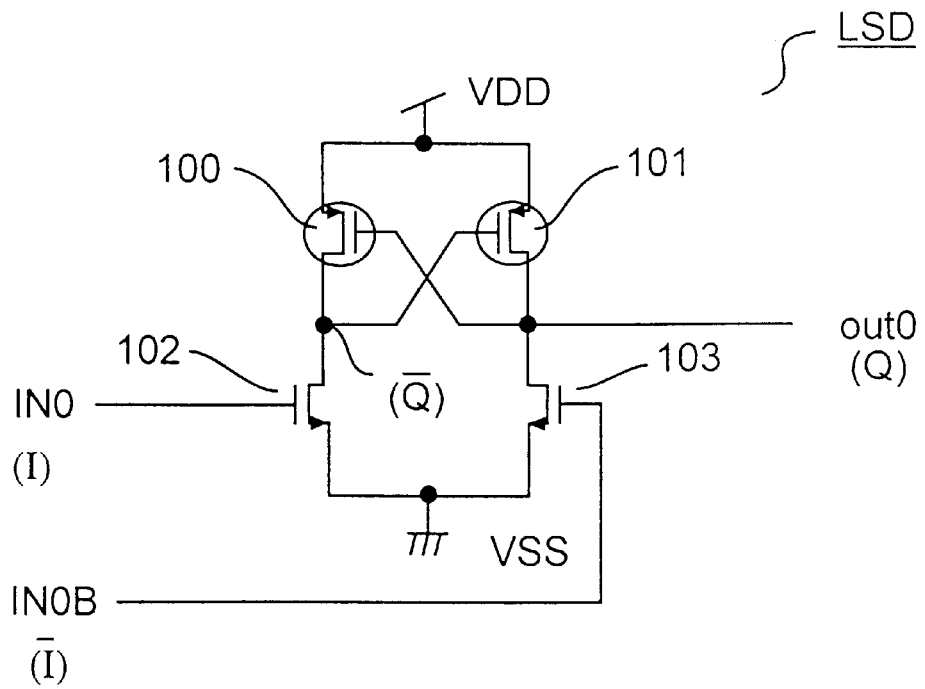
FIGS. 3(a) and 3(b) respectively show a level-down circuit according to a preferred embodiment of the present invention and its operating waveform diagram.
Figure 3B:
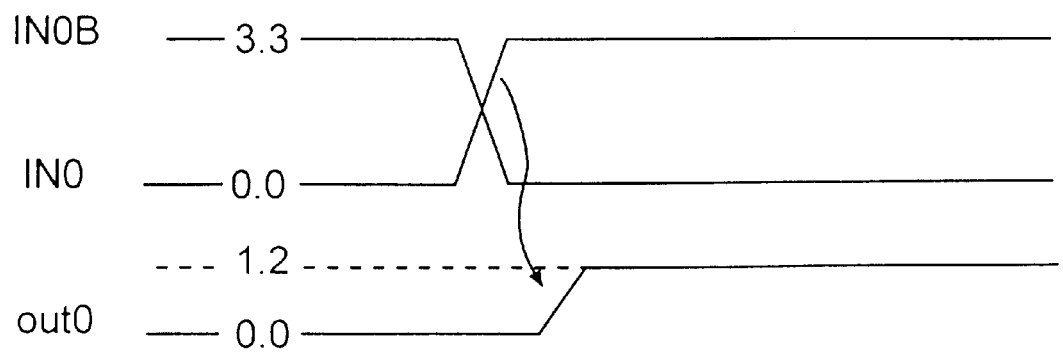

FIG. 3(a) shows a circuit diagram of a level-down circuit according to a preferred embodiment of the present invention. FIG. 3(b) illustrates basic operation waveforms of the circuit. In FIG. 3(a), 3.3 V (large-amplitude) complementary dual rail input signals are represented by IN0 and IN0B. The 1.2 V (small-amplitude) output signal is denoted by out0. Throughout the specification, and particularly with reference to FIGS. 1–13, signals denoted by capital letters (IN, OUT) are 3.3 V (large-amplitude) signals, and signals denoted by lower-case letters (in, out) are 1.2 V (small-amplitude) signals.

Figure 1A:
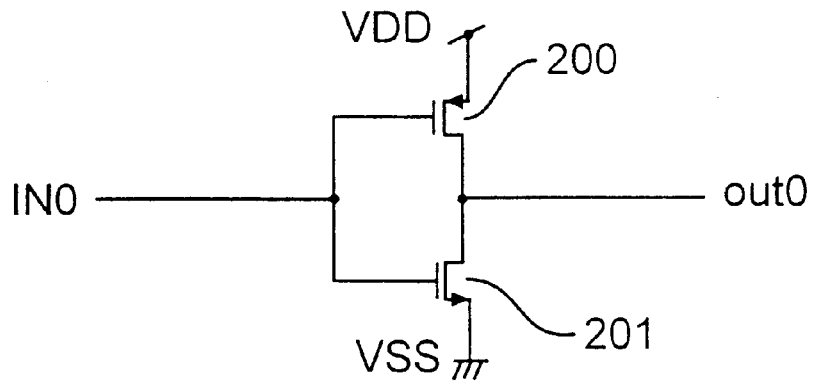
FIGS. 1(a) and 1(b) respectively show a circuit diagram of a conventional level-down circuit and its operation waveform diagram.
Figure 1B:
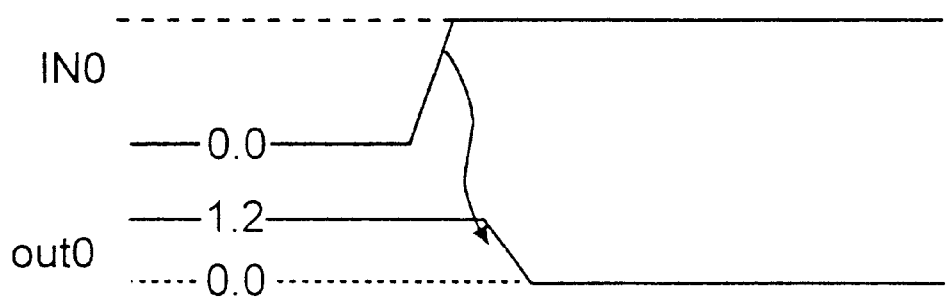
Figure 2A:
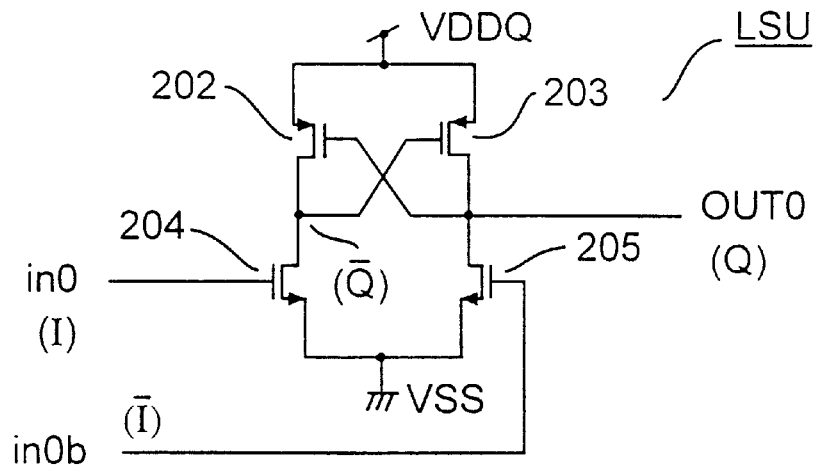
FIGS. 2(a) and 2(b) respectively show a circuit diagram of a conventional level-up circuit and its operating waveform diagram.
Figure 2B:
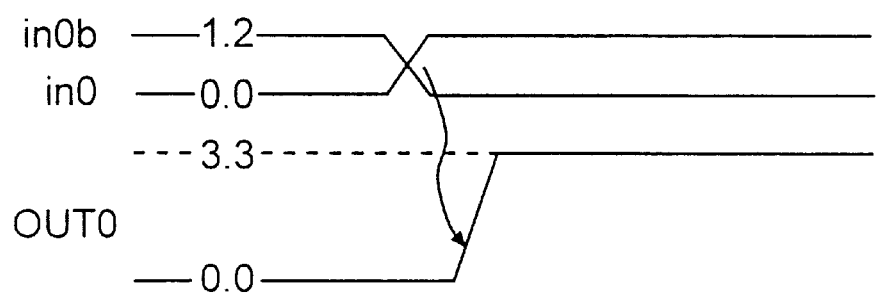

In FIG. 3(a) NMOS transistors 102, 103 have a thick gate oxide layer similar to that of NMOS transistor 201 shown in FIG. 1(a). PMOS transistors 100, 101 have thin oxide layers by comparison. Voltages applied between the gate and drain and between the gate and source of PMOS transistors 100, 101 are small-amplitude voltages VDD (1.2 V) at most, and thus the PMOS transistors 100, 101 do not require gate oxide layers having the large dielectric strength of the gate oxide layers of NMOS transistors 102, 103, which receive large-amplitude signals. Hence, the PMOS transistors 100, 101 have the smaller gate oxide layer thicknesses, and (though not limited) lower threshold values than those of NMOS transistors 102, 103. Using PMOS transistors 100, 101 with thin gate oxide layers makes the circuit capable of higher-speed operation.

In this embodiment, because the circuit receives differential inputs at IN0 and IN0B, erroneous logic levels are not output from out0 even in the presence of ground level fluctuating noise. Moreover, this circuit is not easily influenced by noise even when VDD is lowered.

Another advantage of the present embodiment is that the manufacturing process can be simplified by setting the gate oxide layer thickness and threshold voltage of PMOS transistors 100, 101 equal to those of MOS transistors that form the circuit to which the output out0 is connected, and by setting the gate oxide layer thickness and threshold voltage of NMOS transistors 102, 103 equal to those of the MOS transistors forming a circuit that provides the inputs IN0, IN0B. For example, NMOS transistors 102, 103 may be output stage MOS transistors of an I/O circuit or the MOS transistors used in the protective circuit.

Figure 4A:
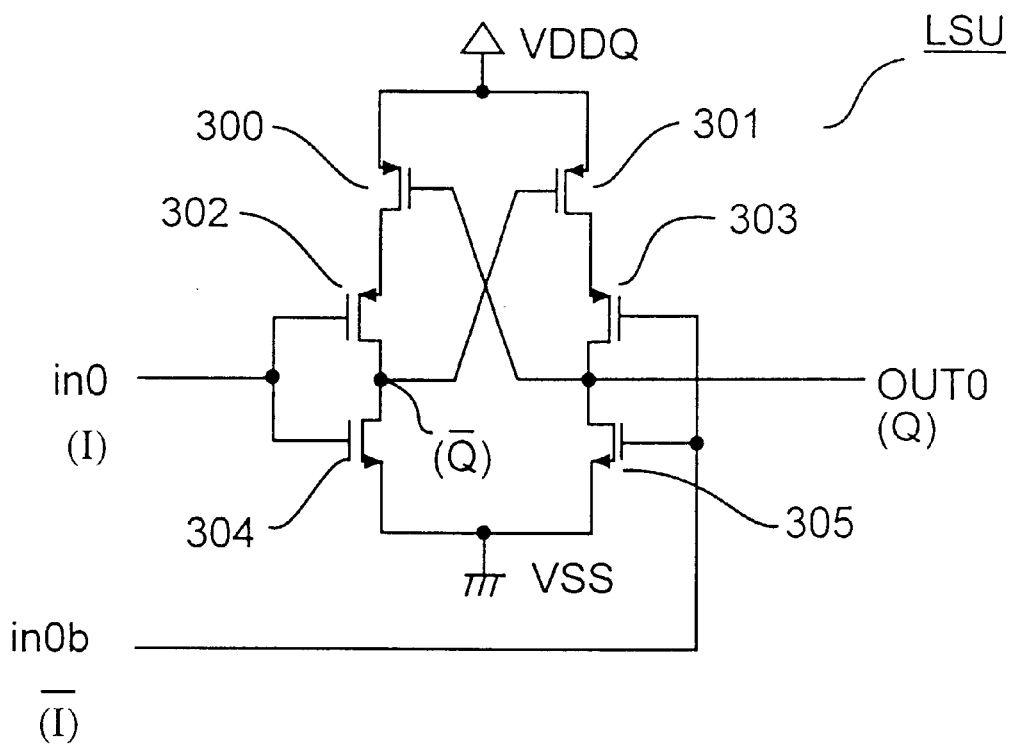
FIGS. 4(a) and 4(b) respectively show a circuit diagram of a preferred embodiment of a level-up circuit of the present invention and its operating waveform diagram.
Figure 4B:
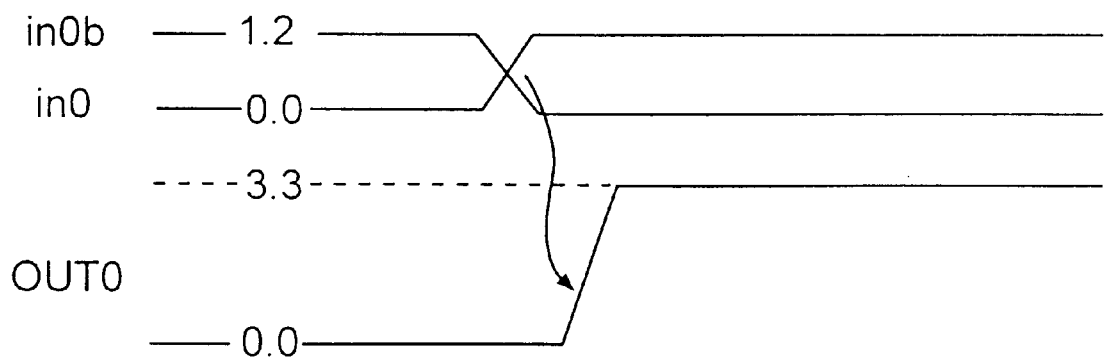

FIG. 4(a) shows an example of a circuit diagram for a level-up circuit, and FIG. 4(b) shows example operation waveforms for the-circuit of FIG. 4(a). Signals in0 and in0b represent complementary dual rail small-amplitude input signals of VDD (1.2 V). The circuit provides a 3.3 V (large-amplitude) output at OUT0.

PMOS transistors 300, 301, 302, 303 have thick gate oxide layers similar to PMOS transistor 200 of FIG. 1(a). NMOS transistors 304, 305 also have thick gate oxide layers like that of NMOS transistor 201 of FIG. 1(a). As shown in FIG. 4(b), the logic level of in0 is increased in amplitude for output at OUT0. Because of the differential inputs, this circuit features strong immunity to noise.

Figure 5A:
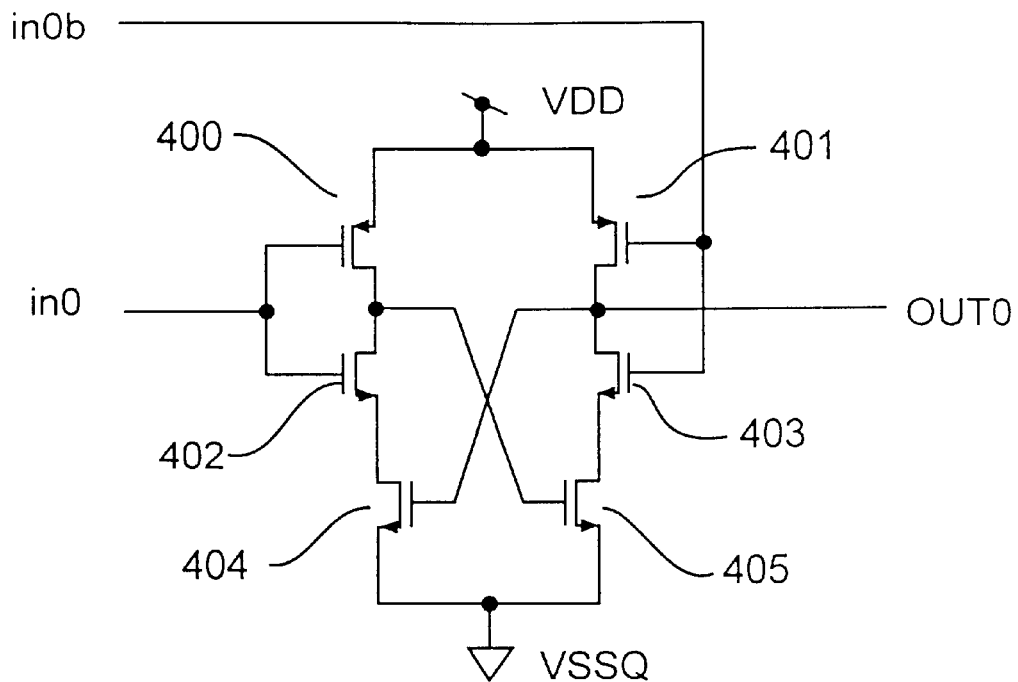
FIGS. 5(a) and 5(b) respectively show a circuit diagram of another embodiment of a level-up circuit of the present invention and its operation waveform diagram.
Figure 5B:
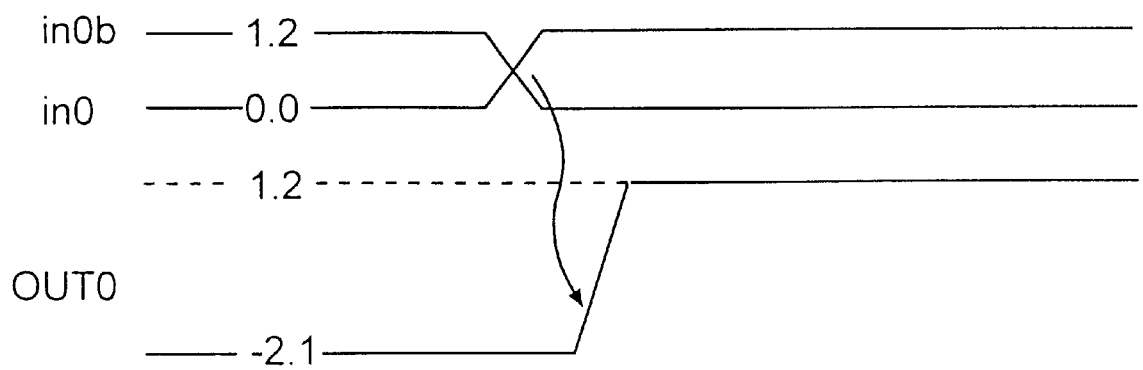

FIGS. 5(a) and 5(b), like FIGS. 4(a) and 4(b), show a level-up circuit diagram and its associated operation waveforms. However, while the circuit of FIG. 4(a) converts a 1.2 V-amplitude signal spanning VDD (1.2 V) to VSS (0 V) into a 3.3 V-amplitude signal spanning VDDQ (3.3 V) to VSS (0 V), the circuit of FIG. 5(a) converts a 1.2 V-amplitude signal spanning VDD (1.2 V) to VSS (0 V) into a 3.3 V-amplitude signal spanning VDD (1.2 V) to VSSQ (−2.1 V). VSSQ is a negative power supply of −2.1 V. Input signals in0 and in0b are small-amplitude complementary dual rail input signals. Output OUT0 has a 3.3 V amplitude (large-amplitude) ranging between 1.2 V and −2.1 V. PMOS transistors 400, 401, 402, and 403 are thick gate oxide layer transistors similar to PMOS 200 of FIG. 1(a). NMOS transistors 404, 405 are thick gate oxide layer transistors similar to NMOS transistor 201 of FIG. 1(a).

As shown in FIG. 5(b), the logic level of in0 is increased in amplitude and output to OUT0. Because of the differential inputs, this circuit features strong immunity to noise, like that of FIG. 4(a).

Since the circuits of FIGS. 4(a) and 5(a) have a complementary relationship, features of the level conversion for both embodiments will be described on the basis of FIG. 4(a) alone. However, such features, including the expansion of the voltage range, are equally applicable to the circuit of FIG. 5(a), albeit in the negative direction in the circuit of FIG. 5(a).

Figure 6:
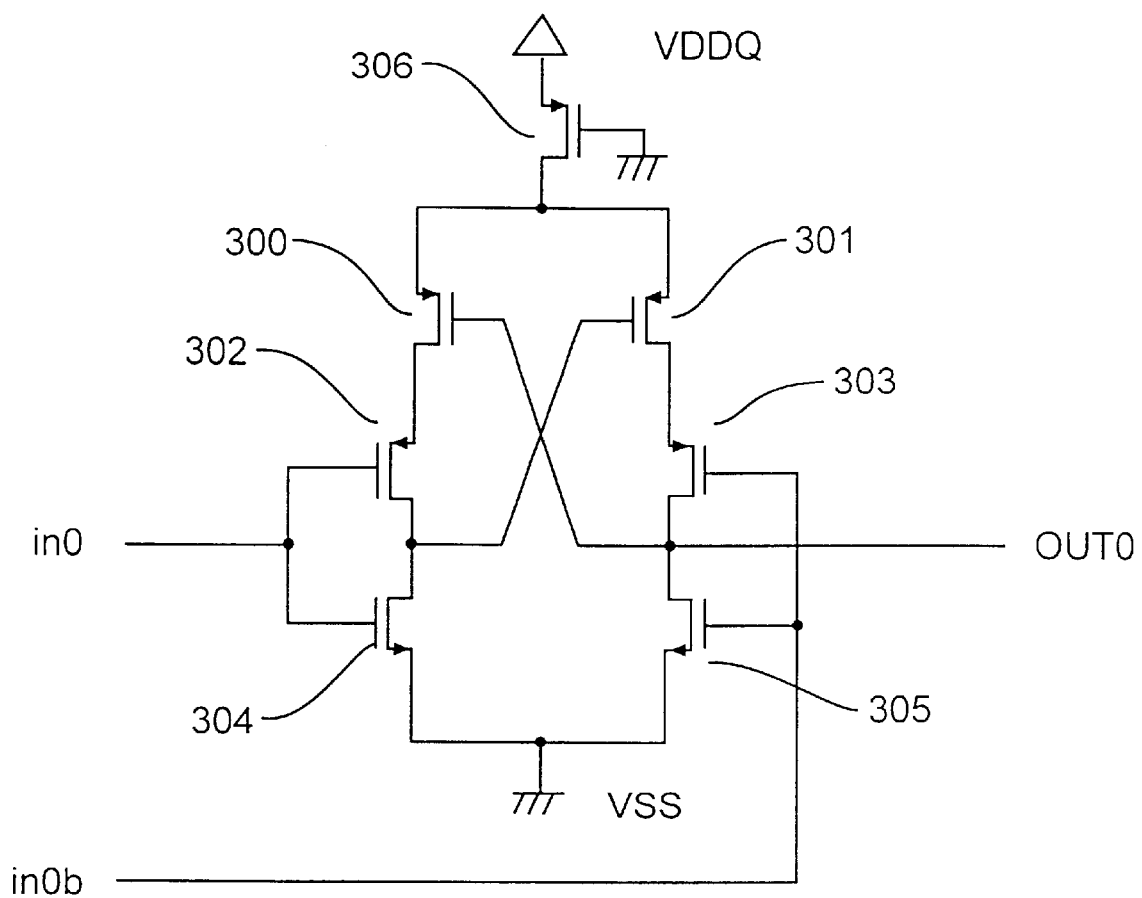
FIG. 6 is a circuit diagram of a further embodiment of a level-up circuit of the present invention.

FIG. 6 illustrates a level-up circuit which is a modification of the circuit of FIG. 4(a), to be used at a lower VDD voltage.

FIG. 6 uses an additional PMOS transistor 306 as a current source. When the voltage of VDD is decreased with VDDQ fixed, the "on" currents (the current existing when the potential differences between the source and gate of NMOS transistors 304, 305 are VDD) are smaller than the "off" currents (the current existing when the potential differences between the source and gate of PMOS transistors 302, 303 are VDD). As a result, the cross-coupled PMOS transistors 300, 301 do not provide inversion. To prevent this, the gate widths of PMOS transistors 300, 301, 302, and 303 must be reduced, and the gate widths of NMOS transistors 304, 305 increased. Doing so, however, leads to an increased area and increased input capacitances respecting the input signals in0 and in0b. Thus, in FIG. 6, PMOS transistor 306 is connected to the power supply VDDQ. This arrangement eliminates the need to reduce the gate widths of PMOS transistors 300, 301, 302, and 303 and to increase the gate widths of NMOS transistors 304, 305. Only PMOS transistor 306 contributes to an area increase, keeping the input capacitances respecting the input signals from increasing.

Although transistor 306 is shown as a PMOS transistor, it may be an NMOS transistor or any other element for limiting the current. Further, the PMOS transistor 306 may be inserted In between PMOS transistors 300 and 302 or between PMOS transistors 301 and 303.

Figure 7A:
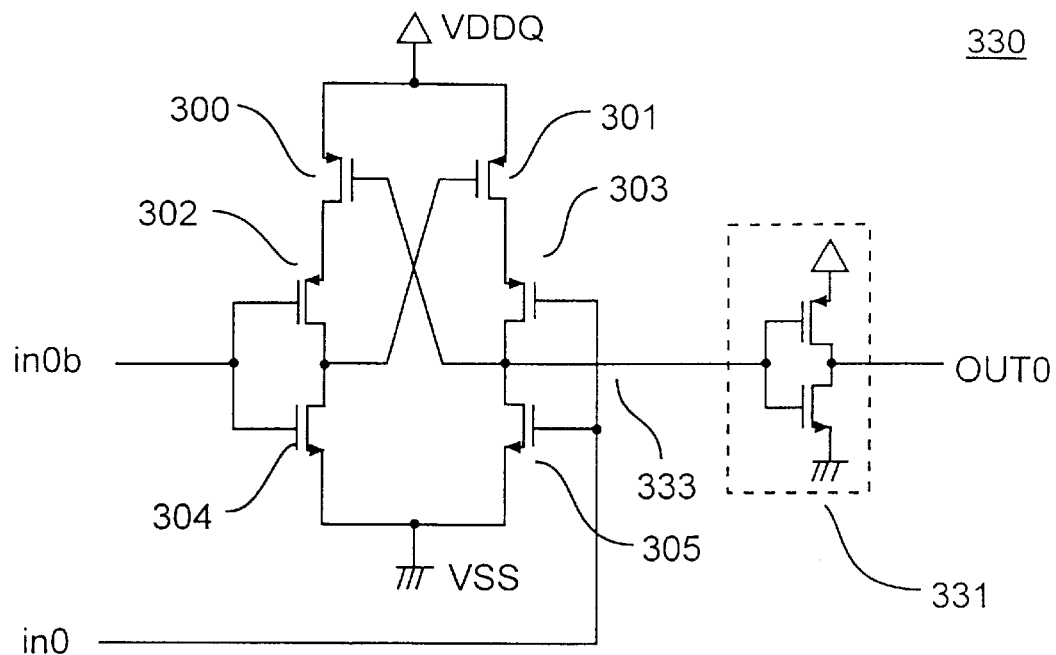
FIGS. 7(a) and 7(b) respectively show a circuit diagram of a further embodiment of a level-up circuit of the present invention, and its operating waveform.

FIG. 7(a) shows another modification of the circuit of FIG. 4(a), in which an inverter circuit 331 is connected to the output stage of the level conversion circuit. Since the output OUT0 of the FIG. 4(a) circuit also serves as an inner node (designated by reference numeral 333 in FIG. 7(a)) of the level conversion circuit, the behavior of the voltage on this inner node may change depending upon the circuit connected to the output. This affects the delay time of the level conversion cell, which in turn may cause an erroneous operation. By inserting the inverter 331 at the output stage as shown in FIG. 7(a), the circuit connected to the output of the level conversion circuit is prevented from adversely affecting the node in the level conversion cell. Further, because the output impedance at OUT0 can be reduced, compared with that of FIG. 4(a), the total delay time when a large number of circuits are connected to OUT0 can be reduced.

When the level conversion cell is to be registered by an automatic arranging/routing tool, by use of the configuration of FIG. 7(a) a high-speed level conversion cell having excellent noise resistance can be configured. Further, because the dependence of delay on the load of the output is the same as that of the CMOS inverter, the dependence of the CMOS can be directly applied to the timing analysis.

Figure 7B:
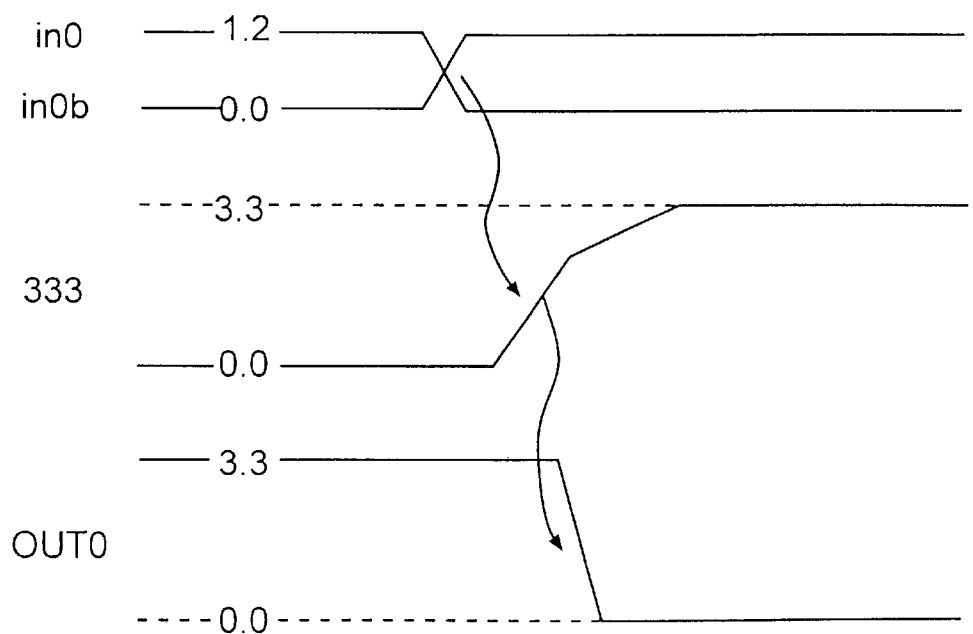

FIG. 7(b) is a waveform diagram for the circuit of FIG. 7(a). Inserting the inverter 331 increases the through-rate of the output OUT0, whereas the through-rate of the inner node 333 itself is slow.

Adding the inverter circuit to the output of the circuit of FIG. 3(a) can also produce a similar effect. Moreover, in the embodiments discussed below, the inverter can be added to the output circuit, although its addition is not specifically mentioned.

Figure 8:
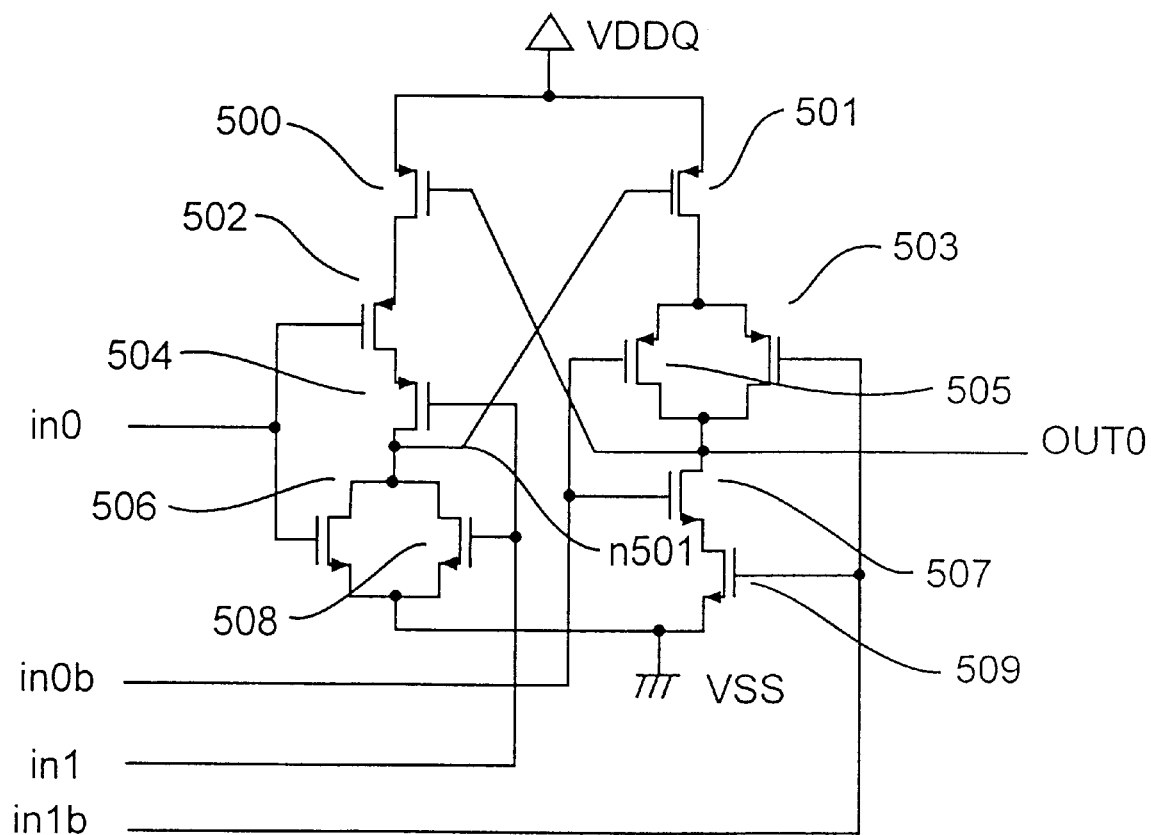
FIG. 8 is a diagram showing a circuit configured by adding a logic operation function to the level-up circuit of FIG. 4(a).

FIG. 8 shows a circuit configured by adding a logic operation function to the level-up circuit of FIG. 4(a). Signals in0 and in1 are 1.2 V (small-amplitude) input signals, and in0b and in1b are their complementary signals. The circuit outputs a 3.3 V (large-amplitude) output signal OUT0. Compared with FIG. 4(a), the inverter comprising MOS transistors 302 and 304 and the inverter comprising the MOS transistors 303 and 305 are replaced by a NOR circuit comprising MOS transistors 502, 504, 506, and 508, and by a NAND circuit comprising MOS transistors 503, 505, 507, and 509. With this arrangement provides the logic operation OUT0=in0 OR in1.

If the NOR circuit comprising MOS transistors 502, 504, 506, and 508 is replaced with a logic circuit that performs an operation LOG1 and a circuit complementary to the LOG1 circuit is replaced with the NAND circuit comprising MOS transistors 503, 505, 507, and 509, a level-up circuit having the logic operation function OUT0=–LOG1 (where "–" represents an inversion) results. Further, while the circuit illustrated in FIG. 8 has two inputs (four inputs when the complementary signals are considered), a circuit configuration having a greater number of inputs may be constructed.

Figure 9:
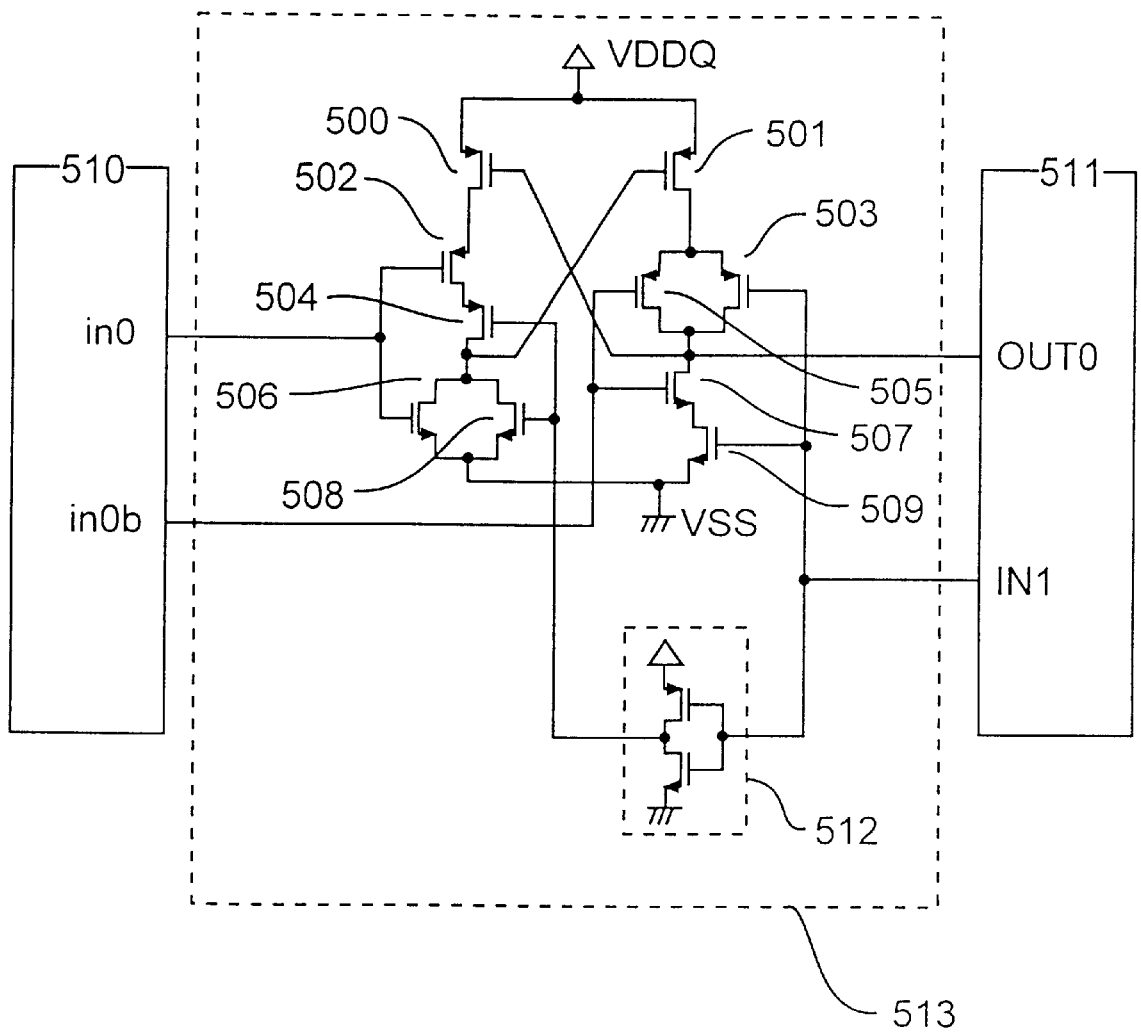
FIG. 9 shows an example of providing the level conversion circuit of FIG. 8 with an output fixing function.

FIG. 9 illustrates a circuit configured by providing the level-up circuit of FIG. 8 with an output fixing function. The level-up circuit with the output fixing function is designated by reference numeral 513. Furthermore, an inverter 512 is provided as shown, input signal in1b is replaced with a 3.3 V (large-amplitude) signal IN1, and in1 is derived from signal IN1 by using the inverter 512.

In FIG. 9, a circuit block 510 operates on a power supply voltage of 1.2 V, and a circuit block 511 operates on a power supply voltage of 3.3 V. Thus, the level-up circuit 513 functions to translate from the circuit block 510 to the circuit block 511. Setting IN1=0 V results in OUT0=3.3 V regardless of the voltage signals in0 and in0b. In this state, no through-current flows from the power supply VDDQ to VSS of the level-up circuit 513.

The power supply of the circuit block 510 can be turned off by setting IN1=0 V. At this time, although the input signals in0 and in0b are undefined, no through-current flows through the level-up circuit 513, and its output OUT0 is determined, so that the circuit block 511 does not operate erroneously.

When the circuit block 510 is constructed of low-threshold MOS transistors, a subthreshold leakage current flows, consuming power even during standby, when the circuit block is not operated. By adopting the configuration of FIG. 9, however, the power supply of the circuit block 510 can be off during standby, thus suppressing the power consumption due to the subthreshold leakage current.

FIG. 9 does not expressly show such circuit constants as the gate widths of the MOS transistors. Since a large-amplitude signal is input at IN1, the gate lengths of MOS transistors 503, 509, 504 and 508 should be set smaller than the gate lengths of MOS transistors 505, 507, 502, and 506. Furthermore, although the level conversion circuits discussed below also do not expressly show the circuit constants, if the CMOS circuit is constructed of MOS transistors having large-amplitude inputs (such as MOS transistors 503, 509, 504, and 508) and MOS transistors having small-amplitude inputs (such as MOS transistors 505, 507, 502, and 506), the symmetry of circuit configuration can be maintained by setting the gate lengths of the MOS transistors supplied with the large-amplitude inputs smaller than the gate lengths of the MOS transistors supplied with the small-amplitude inputs.

Figure 10:
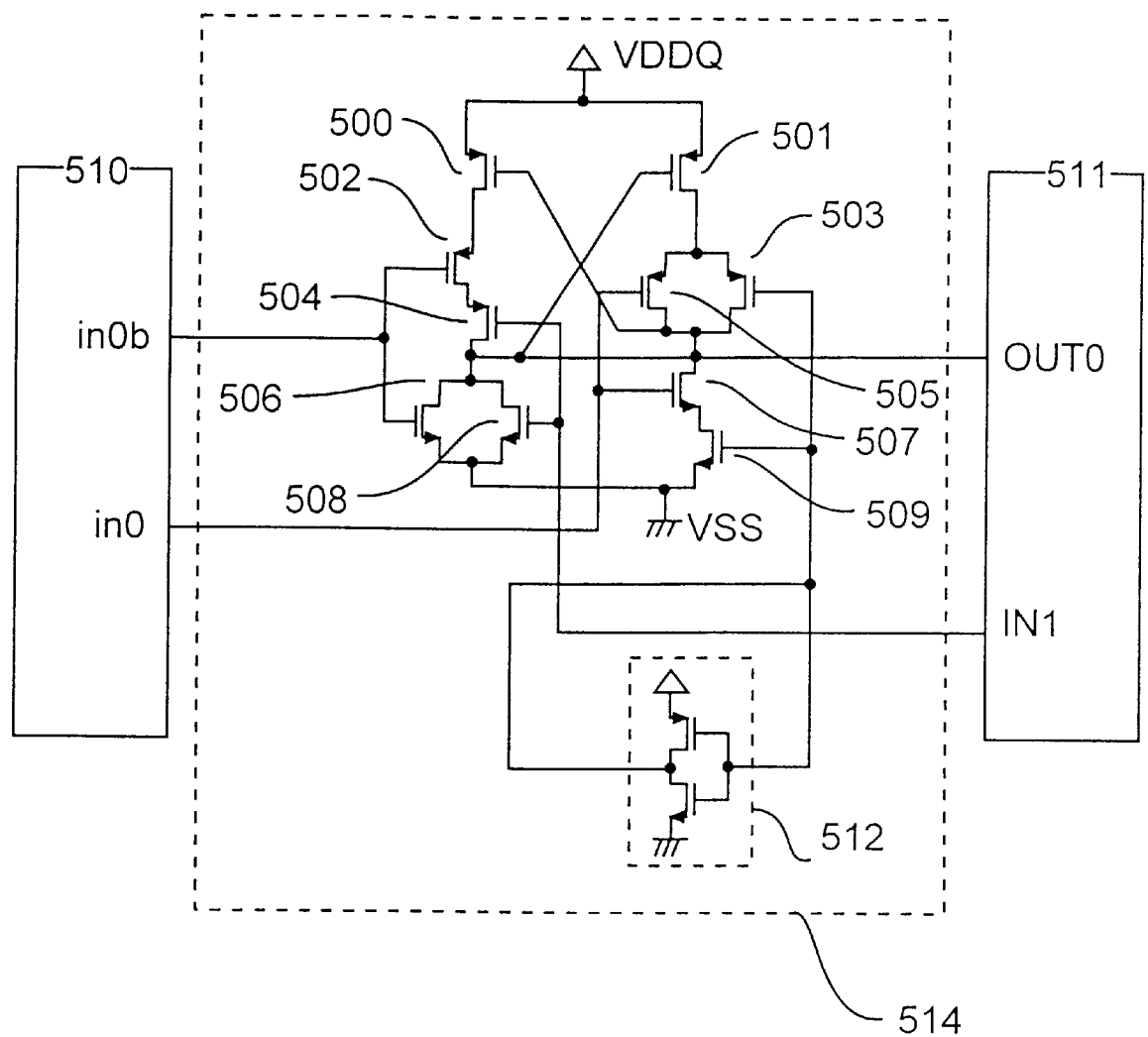
FIG. 10 shows another example of applying the level conversion circuit of FIG. 8 with an output fixing function.

The level-up circuit 514 shown in FIG. 10 has an output fixing function for fixing its output to OUT0=0 V when IN1=3.3 V, by locating the inverter 512 as shown. Furthermore, the output of the FIG. 10 circuit is taken from the node common to the drains of MOS transistors 506, 508, and 504, to which the gate of MOS transistor 501 is also connected. Otherwise, the circuit configuration shown in level 10 is substantially similar to that of FIG. 9. Therefore, when it is necessary to fix the output at OUT0=3.3 V, the level-up circuit 513 of FIG. 9 is used; and when it is necessary to fix the output at OUT0=0 V, the level-up circuit 514 of FIG. 10 is used.

Figure 11:
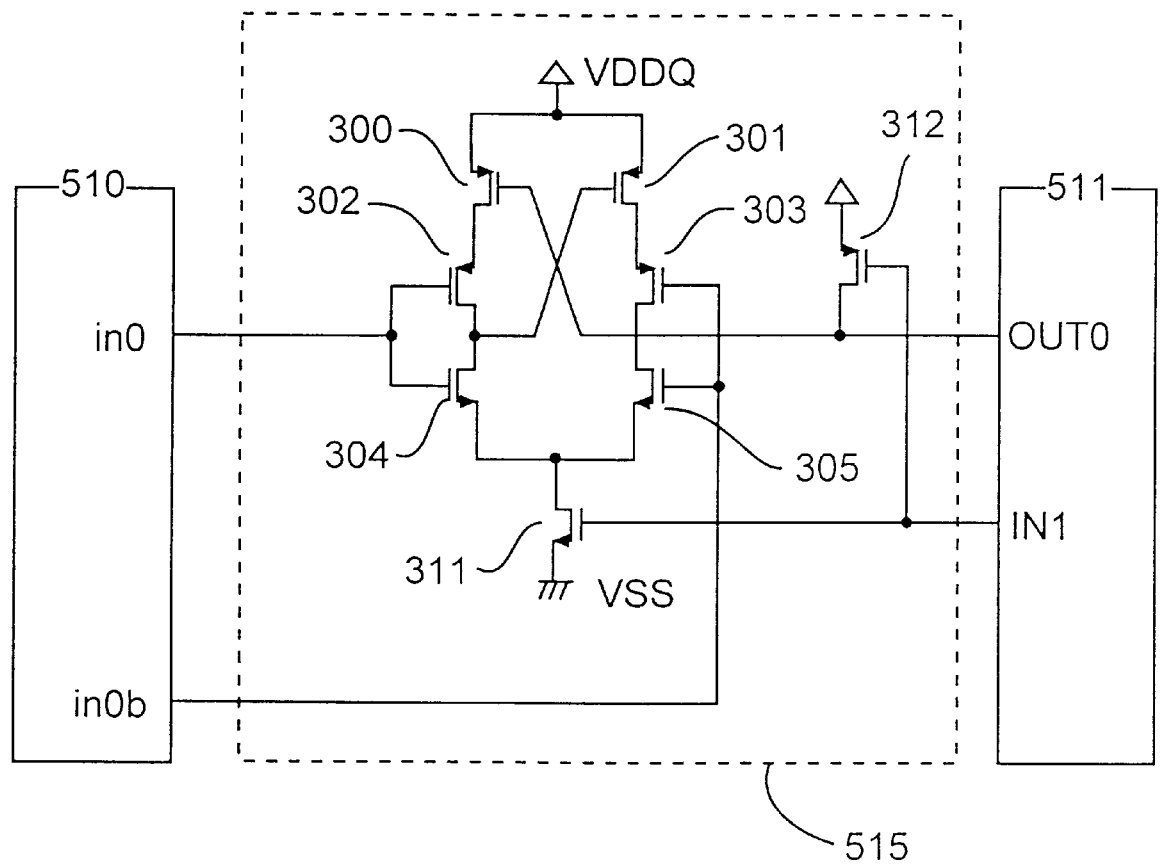
FIG. 11 shows a further example of a level-up circuit having an output fixing function.
Figure 12:
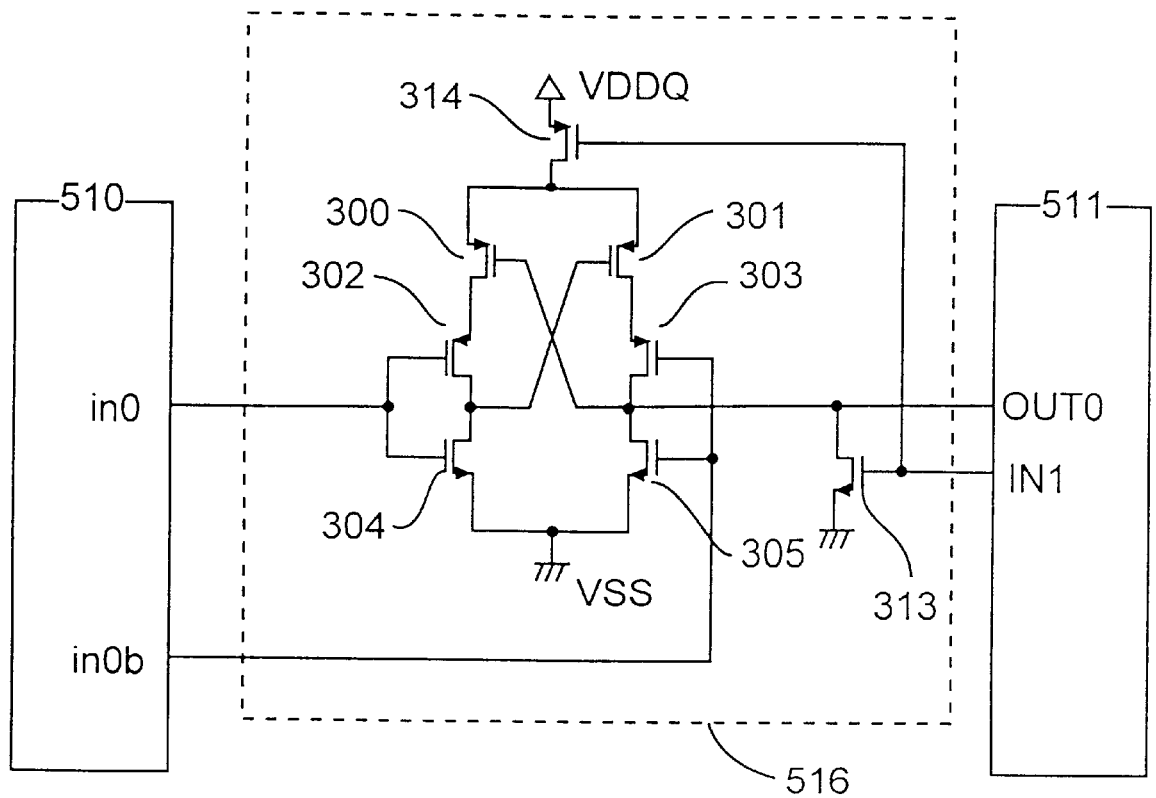
FIG. 12 shows still another example of a level-up circuit having an output fixing function.

FIGS. 11 and 12 respectively illustrate circuits that realize the functions of FIGS. 9 and 10 with a different construction. Level-up circuit 515 and 516 of FIGS. 11 and 12, respectively, have an output fixing function. When the power supply of the circuit block 510 is turned off, no through-current flows between the power supplies of circuits 515, 516 when input IN1 is set to an appropriate level, thereby stabilizing the output OUT0.

In each of FIGS. 9–12, level-up circuits having an output fixing function have been shown, whereby the output OUT0 is fixed to a predetermined level. Combining each of these circuits with a latch circuit forms a circuit that holds the output level OUT0 when IN1 becomes a predetermined value.

Figure 13:
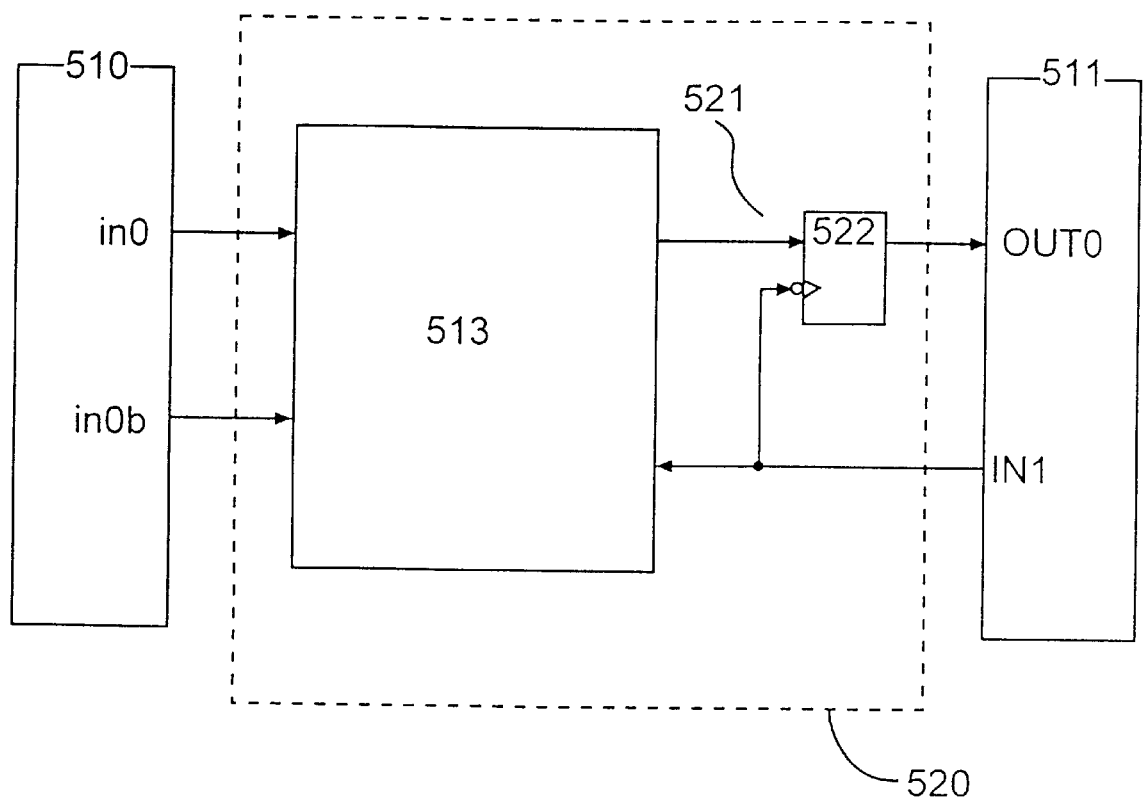
FIG. 13 shows an example of a level-up circuit having an output fixing function of a type that holds the level-converted output.

FIG. 13 shows a preferred example. Level-up circuit 513 of FIG. 9 is shown, with a latch circuit 522 at its output. When IN1 changes from 3.3 V to 0 V, the latch circuit 522 latches the signal level of the output 521 of level-up circuit 513 to OUT0. When IN1 is 0 V as described above, the power supply of the circuit block 510 can be turned off. Although at this time the voltages of inputs in0 and in0b become undefined, no through-current flows in the level-up circuit 513 and its output OUT0 is determined, so that the circuit block 511 does not operate erroneously.

The latch circuit 522 can also be applied to the level-up circuit shown in FIGS. 10–12 in a similar manner, providing a similar effect.

Figure 14:
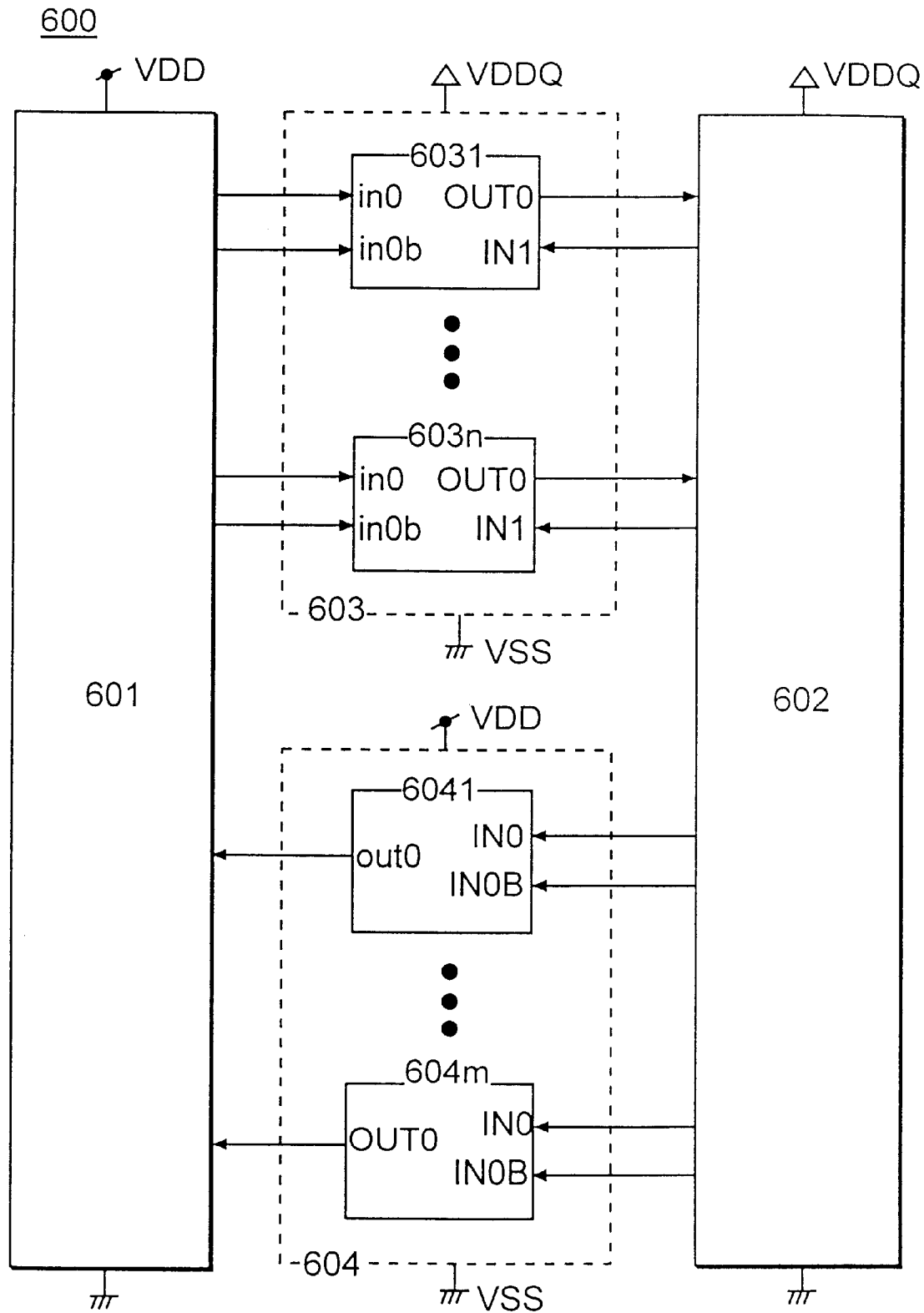
FIG. 14 shows a system using a level conversion circuit according to the present invention.

FIG. 14 shows an example of a circuit system employing the above-described level-up circuits having an output fixing function, and level-down circuits. A low-voltage circuit block 601 is supplied with VDD=1.2 V, and constructed of low-threshold MOS transistors. A high-voltage circuit block 602 is supplied with VDDQ=3.3 V, and constructed of MOS transistors having a higher threshold than that of the MOS transistors forming circuit block 601. Hence, the subthreshold leakage current flowing between power supplies in the circuit block 602 is negligible compared with that of the circuit block 601. Level-up circuits 6031 to 603n (such as those shown in FIGS. 9–14) having an output fixing function and level-down circuit 6041 to 604n (such as that shown in FIG. 3(*a*)) are used to transfer signals between the circuit blocks 601, 602.

Because the circuit block 601 is constructed with low-threshold MOS transistors, a subthreshold leakage flows, consuming power even during standby mode when the circuit block 601 is not being operated. By inputting an appropriate value by each IN1 of a group of level-up circuits 603 during standby, however, the power supply of the circuit block 601 can be turned off, suppressing the power consumption due to the subthreshold leakage current. Further, because the outputs OUT0 of the level-up circuits 603 are fixed, the circuit block 602 does not operate erroneously.

Although the circuit functions incorporated in the circuit block 602 are not limited, the circuit block 602 may include circuits having a clock function and memories whose power supplies cannot be turned off, thereby allowing the power supply of the circuit block 601 to be turned off frequently. For turning off the power supply of the circuit block 601, a PMOS, for example, may be inserted between the circuit block 601 and the power supply VDD. Integrating the circuit system 600 in a single chip eliminates the need to provide a switch outside the chip for turning off the circuit block 601.

Figure 15:
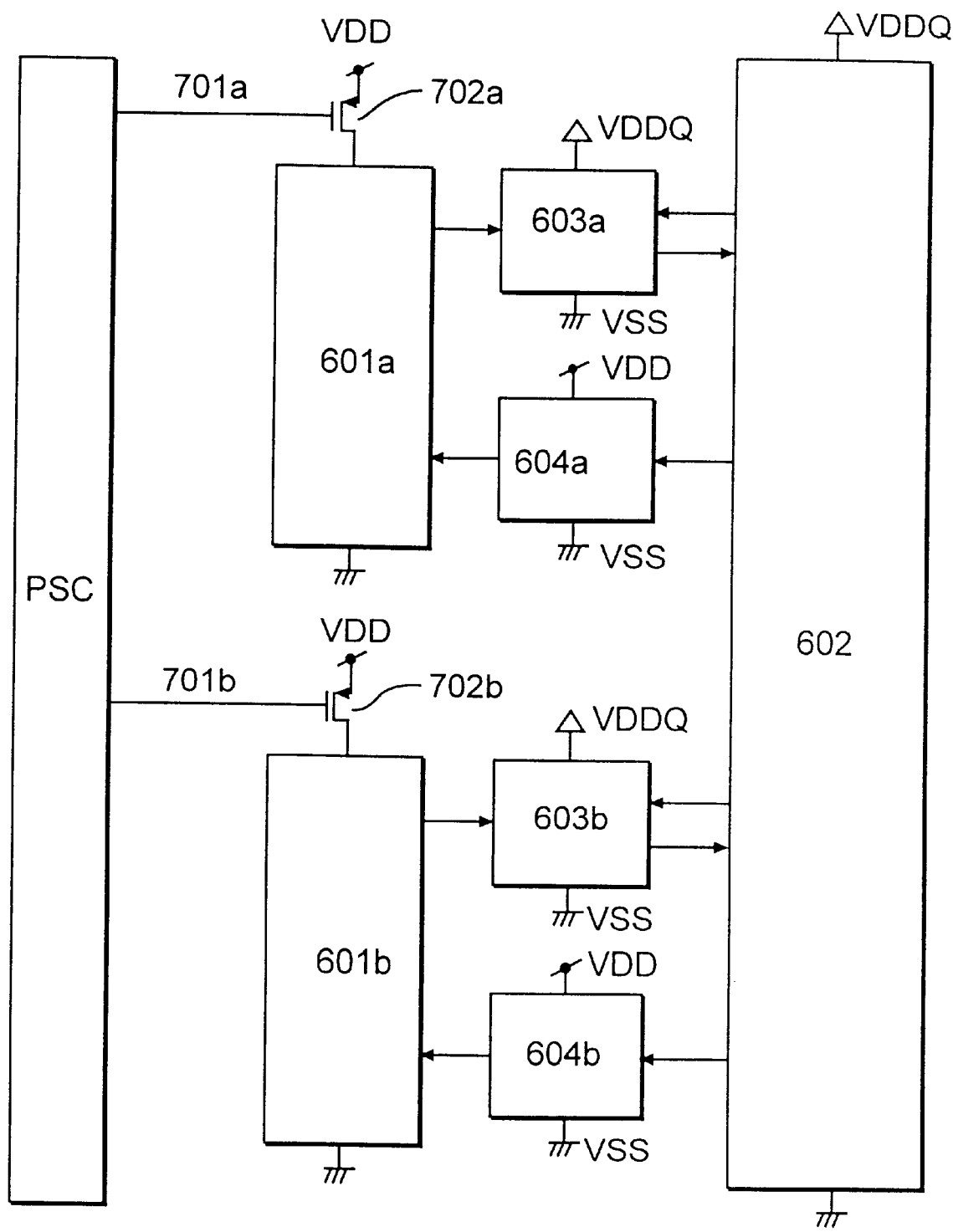
FIG. 15 shows a system using a level conversion circuit of this invention when a circuit block comprising low-threshold MOS transistors is divided into two.

FIG. 15 shows a preferred embodiment wherein the circuit block 601 is divided into two systems, circuit block 601a and circuit block 601b.

The circuit block 601 as shown in FIG. 14 has a drawback that when its power supply is turned off, the voltages on the nodes inside the circuit block 601 become undefined, and information contained in memory circuits (such as SRAMs and DRAMs, if any) in the circuit block 601 cannot be maintained.

In FIG. 15, circuits, such as memories, whose power supplies cannot be turned off are incorporated in the circuit block 601a, while circuits whose power supplies may be turned off are incorporated in the circuit block 601b. A power switch control circuit PSC is provided to turn on or off power switch PMOS transistors 702a, 702b with signals 701a, 701b from the PSC. Level-up circuits 603a and 603b have an output fixing function, and level-down circuits 604a and 604b are also provided. A fixing circuit is preferably inserted between circuit blocks 601a and 601b to prevent the erroneous operation of the circuit block 601a when the power supply for the circuit block 601b is turned off; however, the fixing circuit is not shown. It can be easily realized by using CMOS circuits such as a NAND and NOR.

The system configuration of FIG. 15 has two standby states. One is a state in which the power switch PMOS transistor 702b is turned off to turn off the power supply of the circuit block 601b (standby 1). The other is a state in which, in addition to standby 1, the power switch PMOS transistor 702a is also turned off to turn off the power supply of the circuit block 601a (standby 2). Standby 1 can reduce the subthreshold leakage current of the circuit block 601b. The circuit block 601b, because it does not incorporate such circuits as memories, is free from erroneous operation when its power supply changes from "on" to "off". Hence, recovery from standby 1 can be accomplished at high speed. On the other hand, when the standby state shifts to standby 2 where the power supply of the circuit block 601a is off, the contents of the memories in the circuit block 601a are erased, and consequently the recovery from standby 2 takes time. However, standby 2 can reduce the subthreshold leakage current of the circuit block 601a in addition to setting up standby 1, thus achieving lower power consumption. If the operation of the circuit blocks 601a and 601b is stopped for a relatively short period of time, the standby state should be standby 1. When the operation is stopped for a long period, the standby state should be standby 2.

Figure 16:
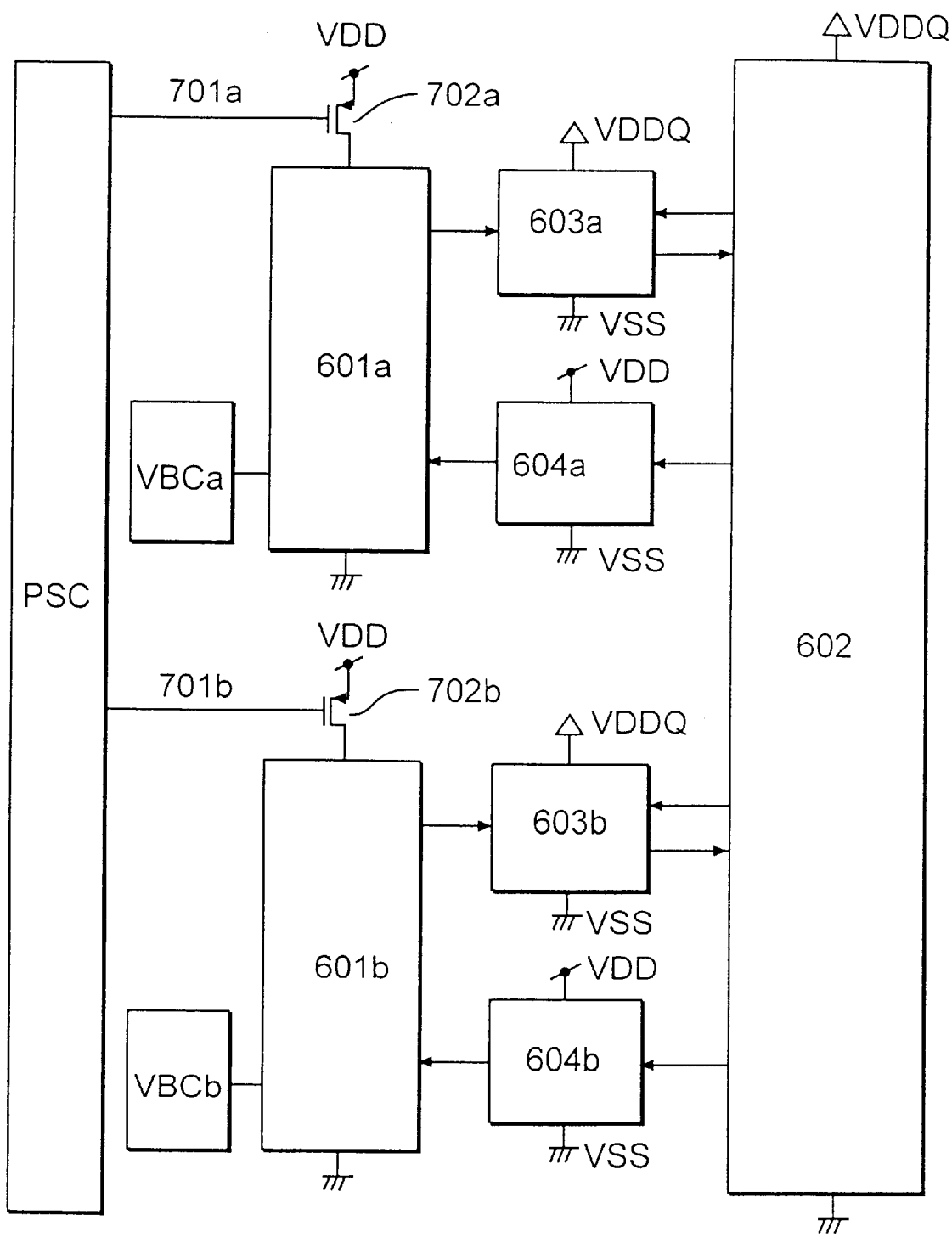
FIG. 16 shows the system of FIG. 15 with a substrate bias control added.

FIG. 16 shows an embodiment in which substrate bias control circuits VBCa and VBCb are added to the circuit of FIG. 15. As described above, a subthreshold leakage current flows in the circuit block 601a during standby 1. The substrate bias control circuit VBCa controls the substrate voltage of the MOS transistors in the circuit block 601a during standby 1 as follows:

(1) For PMOS transistors, the substrate voltage is controlled at a level higher than the power supply voltage.

(2) For NMOS transistors, the substrate voltage is controlled at a level lower than the power supply voltage.

This control raises the threshold voltage of the MOS transistors in the circuit block 601a, and reduces the subthreshold leakage current. Because the power supply remains turned on, the contents of the memories in the circuit block 601a are maintained.

The substrate bias control circuit VBCb connected to the circuit block 601b can be used during an IDDQ test. During the IDDQ test, a circuit to be measured is cut off from a power supply line, and thus the power switches PMOS 702a and 702b cannot be turned off. The use of the substrate bias control circuits VBCa and VBCb, which raise the threshold voltage of the MOS transistors forming the circuit blocks 601a and 601b to reduce the subthreshold leakage current, allows the IDDQ test to be executed.

The use of the substrate bias control circuits VBCa, VBCb is not limited to the circuit configuration of FIG. 16, but can be applied to any system which comprises a first circuit block constructed of high-threshold MOS transistors and supplied by a large-amplitude voltage, and a second circuit block constructed of low-threshold MOS transistors and supplied with a small-amplitude voltage, and in which the first and second circuit blocks interface with each other via level-up circuits with an output fixing function and level-down circuits. The first circuit block may incorporate circuits which need to operate at high-speed, and the second circuit block may include circuits that can operate at low speed and do not consume much power, such as an RTC. The first circuit block is divided into circuit blocks 1A and 1B, the circuit block 1A containing circuits such as a memory that takes time for recovery when the power supply is turned off, and the circuit block 1B containing other circuits. These divided circuit blocks 1A, 1B control their power supplies and incorporate a substrate bias control circuit.

Figure 17A:
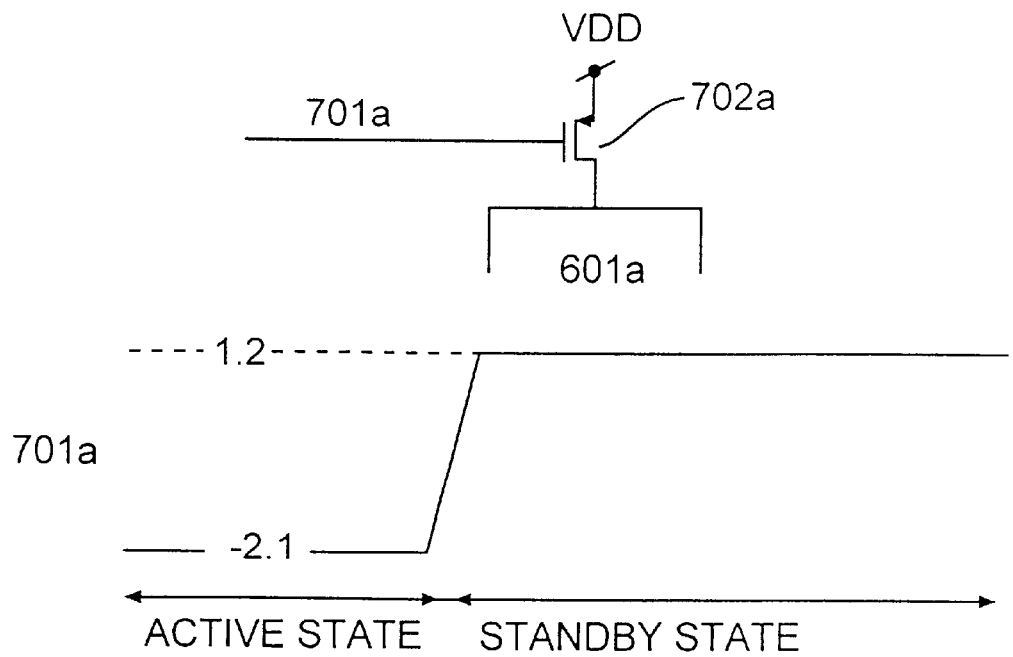
FIG. 17(a) shows an embodiment for controlling a power switch of FIGS. 15 and 16.
Figure 17B:
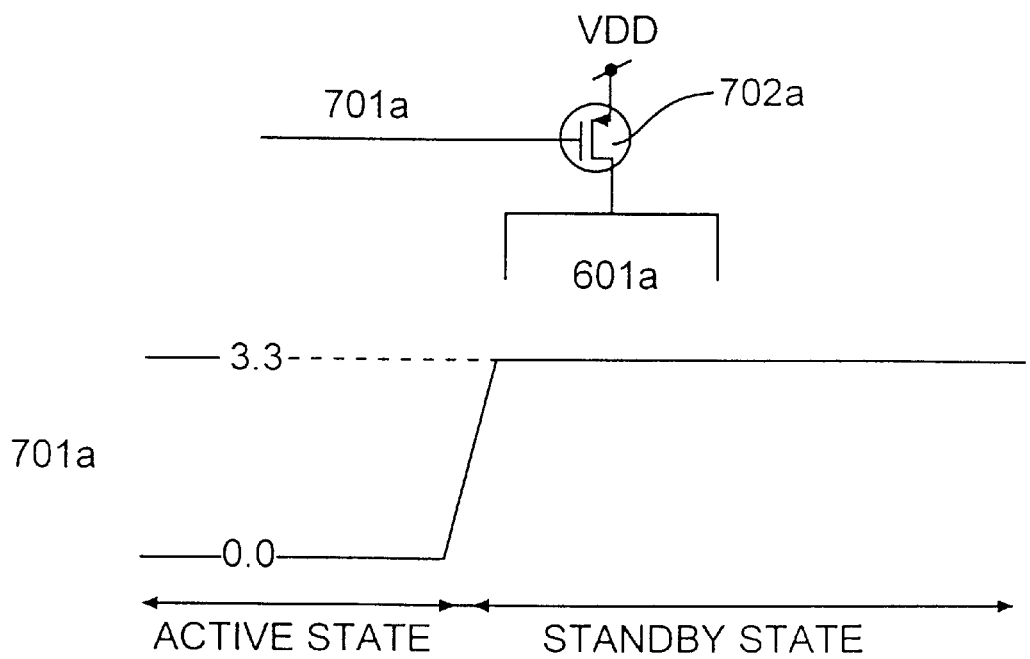
FIG. 17(b) shows an example of a method of controlling the power switch of FIGS. 15 and 16 when a low-threshold MOS transistor is used for the power switch.

FIG. 17(*a*) shows an embodiment for controlling the power switch PMOS 702a used in FIGS. 15 and 16. In FIG. 17(*a*), the power switch 702a is a high-threshold PMOS transistor. When the transistor is active, the voltage 701a on the gate terminal is controlled at a negative value as long as the dielectric strength of the gate oxide film permits. This enables a large current to flow through the PMOS transistor. The negative voltage to be applied may be, for example, a negative voltage used for the substrate bias control. In the standby (inactive) state, the gate voltage 701a is controlled at 1.2 V (VDD). Because the power switch PMOS transistor 702a is a high-threshold MOS transistor, this gate voltage is high enough to turn off the power switch PMOS 702a.

FIG. 17(*b*) shows an embodiment for controlling a low-threshold PMOS transistor power switch 702a. When active, the gate voltage 701a of the power switch PMOS transistor 702*a* is controlled at 0 V. Because the power switch PMOS transistor 702*a* is a low-threshold MOS transistor, a large current can flow. In the standby state, the gate voltage 701*a* is controlled at a positive value as long as the dielectric strength of the gate oxide film permits. Here, it is illustratively controlled at 3.3 V, and the power switch PMOS 702*a*, although a low-threshold MOS transistor, can have a satisfactory on-off characteristic.

The control shown in FIGS. 17(*a*) and 17(*b*) is not limited to PMOS transistor control, but can likewise be applied with an NMOS power switch to produce the same effect, except that the polarity is inverted.

Figure 18:
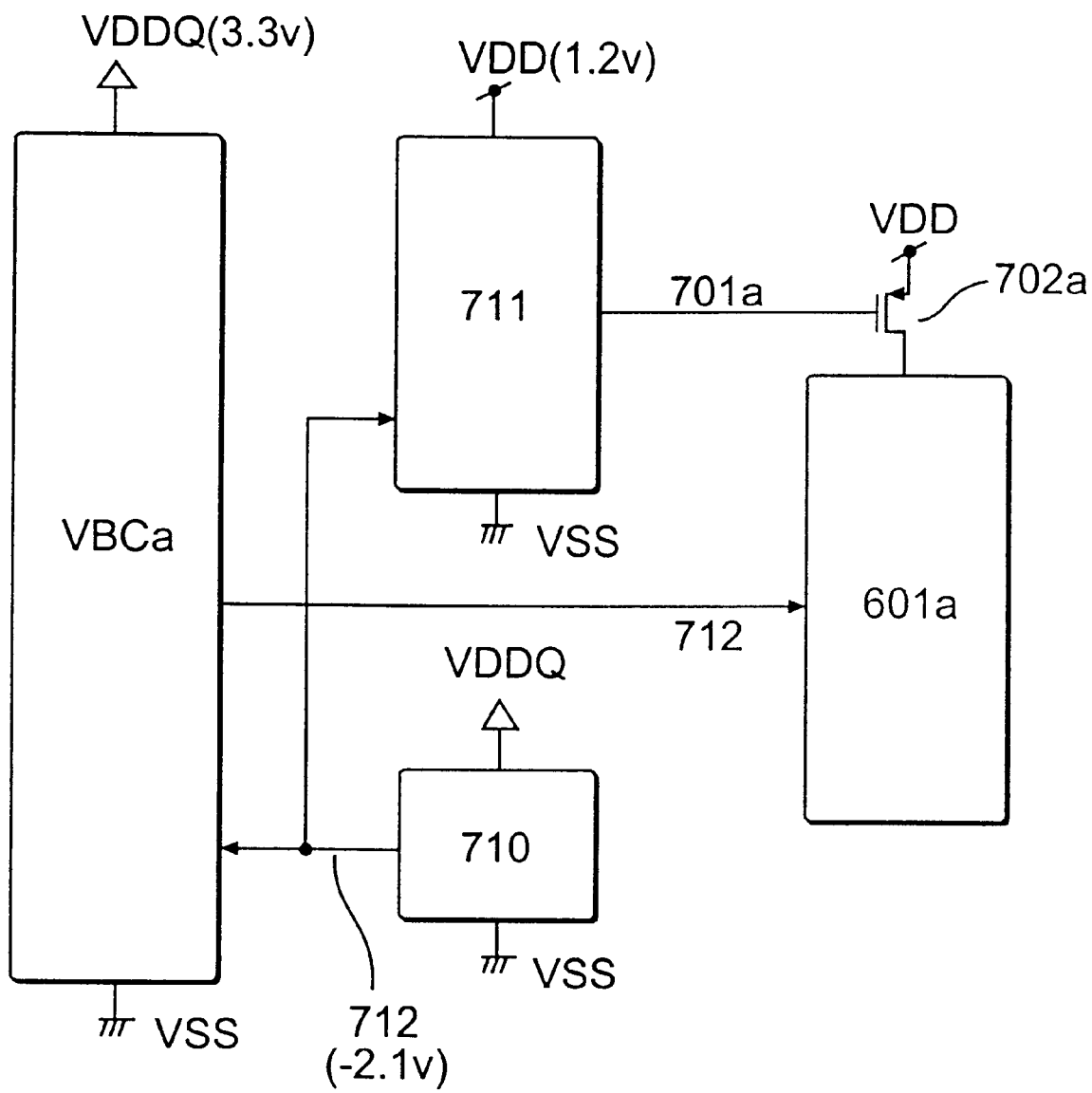
FIG. 18 shows an embodiment for generating a gate voltage for the embodiment shown in FIG. 17(a).

FIG. 18 shows an embodiment for generating the gate voltage 701*a* shown in FIG. 17(*a*). A negative voltage generating circuit 710 generates −2.1 V from 3.3 V (VDDQ) and outputs it at 712 to a power switch control circuit 711. The power switch control circuit 711, which controls the gate voltage 701*a*, is also supplied with VDD (1.2 V). The −2.1 V supply voltage 712 is also the substrate bias provided to the circuit block 601*a* for control of the substrate voltage of its MOS transistors, via VBCa. By commonly using the negative supply voltage 712 for the substrate bias control and for the control of the power switch 702*a* enables a significant reduction in the size of the circuit required to realize the control of FIG. 17(*a*).

Next, an example of an input/output circuit using the above-mentioned conversion circuits and connected to an external terminal (pin) of the IC (semiconductor integrated circuit) will be described with reference to FIG. 19.

Figure 19:
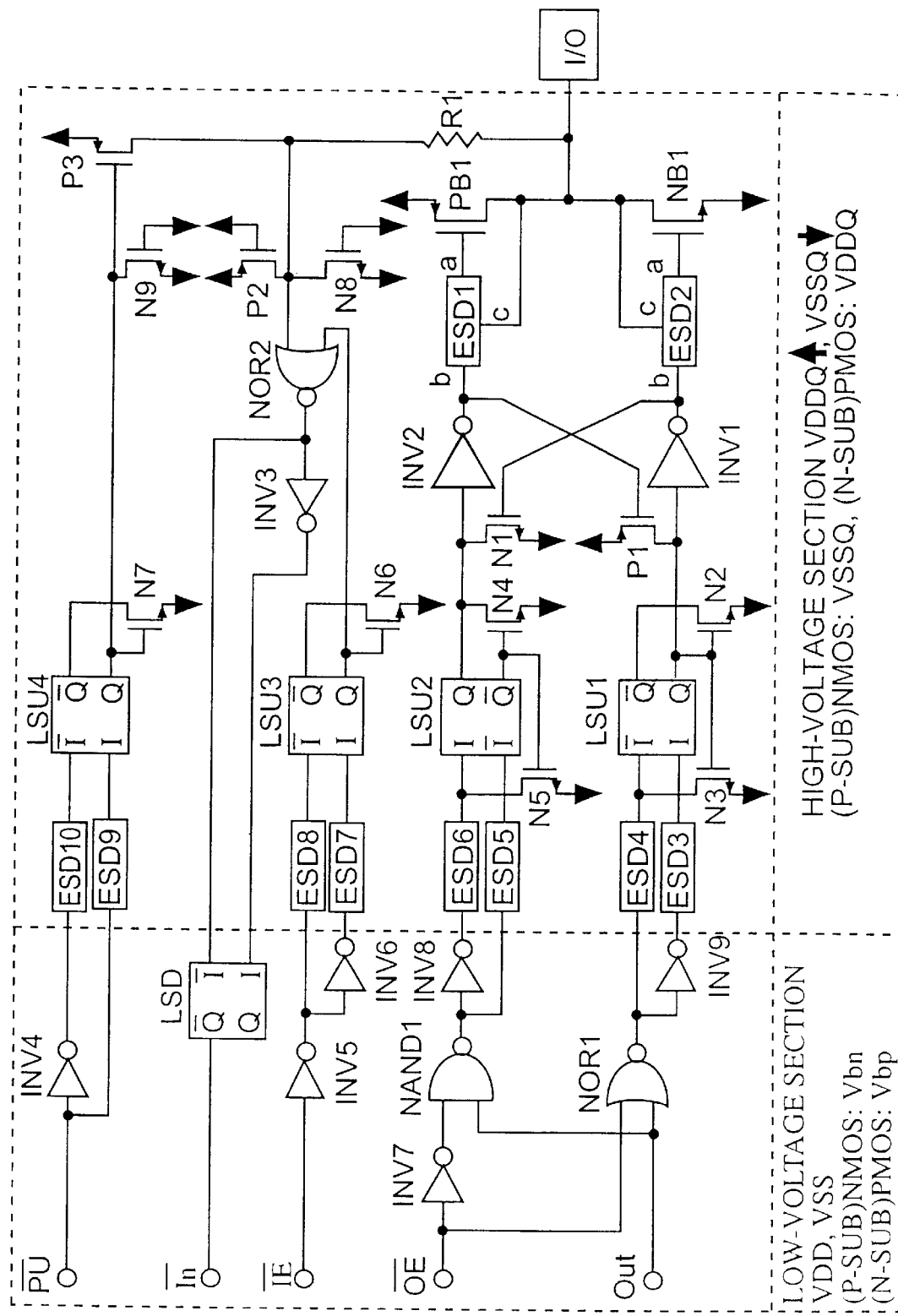
FIG. 19 shows an example of an input/output circuit connected to the external terminal (pin) of an IC (semiconductor integrated circuit) according to a preferred embodiment of the present invention.

In FIG. 19, symbols PB1 and NB1 denote PMOS transistors and NMOS transistors, respectively, both having conductances sufficiently high to drive the load of an external circuit to be connected to external terminals I/O. Both PB1 and NB1 constitute an output buffer circuit. An inverter INV7, a NAND gate NAND1, and a NOR gate NOR1 constitute a circuit that e performs a tristate logic operation by which, when an output control signal /OE is "0", the information of the output signal Out is led through an output buffer to the external terminal I/O (a MOS transistor in the output buffer is turned on to bring the output buffer to a low output impedance state), and in which, when /OE is "1", both MOS transistors of the output buffer are turned off regardless of the state of the output signal Out to bring the output buffer to a high output impedance state.

The external terminal I/O is also connected to the input side of a NOR gate NOR2 and used as a common terminal for input and output. When input control signal /IE is logic "0", the NOR gate NOR2 transfers information, which has been supplied to the external terminal I/O from the outside of the IC, to a terminal /In (the /In terminal is the inverted level of a signal supplied to the external terminal I/O), and, when the input control signal /IE is logic "1", blocks the transfer of the information (the /In terminal is forcedly held at logic "0").

P3 is a pull-up PMOS transistor which is used to supply the external input—which takes on either a logic "0" or an open state (high impedance state)—to the I/O terminal. When pull-up control signal /PU is logic "0", P3 conducts to transfer to the NOR gate NOR2 a signal of logic "0" when the external input is logic "0", and a signal of logic "1" when the external input is in an open state. The channel length of transistor P3 is set larger than its channel width W so that the impedance of P3 while it conducts is sufficiently larger than that while the external input is "0".

A low-voltage power supply circuit block is shown at the lefthand side of FIG. 19 within a dotted-line rectangle, in which, in the range shown, an N-type substrate (N-type well) N-SUB for all PMOS transistors is connected to a PMOS well power supply Vbp and a P-type substrate (P-type well) P-SUB for all NMOS transistors is connected to an NMOS well power supply Vbn. The supply voltages are Vss (0 V) and Vdd (1.2 V). Almost all MOS transistors have lower threshold voltages than that of a high-voltage power supply circuit described below, and the gate insulating layers are thin. The minimum channel length of this circuit block is, for example, 0.2 μm, which is shorter than 0.32 μm, the minimum channel length of the high-voltage power supply circuit.

For the inverter circuits INV4–INV9, the circuit of FIG. 20(*a*) may be used, and for the NAND circuit NAND1 and the NOR circuit NOR1, the circuits of FIG. 20(*b*) and 20(*c*), respectively, may be used.

A high-voltage power supply circuit block is shown at the righthand side of FIG. 19 enclosed by a dotted-line rectangle. This circuit block has power supply voltages Vssq (0 V) and Vddq (3.3 V). In the range shown in the drawing, an N-type substrate (N-type well) N-SUB for all PMOS transistors is connected to the power supply Vddq and a P-type substrate (P-type well) P-SUB for all NMOS transistors is connected to the power supply Vssq. All MOS transistors have a high threshold voltage and thick gate insulating layers. Although the power supplies Vss and Vssq may be connected together outside the IC (for example, on the printed circuit board on which the IC is mounted), their external terminals (pins), bonding pads, and internal circuits inside the IC are separated to prevent variation of the load current from entering the power supply wiring and causing operational noise.

Symbol LSD in the low-voltage power supply circuit denotes a level shift (level-down) circuit that converts a high-amplitude signal of 3.3 V, supplied through the high-voltage power supply circuit, into a low-amplitude signal of 1.2 V that can be processed in the low-voltage power supply circuit. The LSD may be the circuit shown in FIG. 3(*a*), in which MOS transistors 102 and 103 have thick gate insulating layers that are preferably formed by the same gate oxide layer forming process used to form the MOS transistors of the high-voltage power supply circuit. The channel length of the MOS transistors 102 and 103 is the minimum channel length of the high-voltage power supply circuit (0.32 μm), not the minimum length of the low-voltage power supply circuit of (0.2 μm).

The MOS transistors of the low-voltage circuit of FIG. 19, in the range shown, have thin gate insulating layers except for the level-down circuit LSD, and have channel lengths equal to the minimum channel length of the low-voltage power supply circuit of (0.2 μm).

LSU1–LSU4 in the high-voltage power supply circuit are level shift circuits for raising the level of the 1.2 V low-amplitude signal supplied from the low-voltage power supply circuit to a high-amplitude signal of 3.3 V, using the circuit shown in FIG. 4(*a*) or any of the other level-up circuits described herein, for example.

INV1 and INV2 constitute a pre-buffer circuit to drive the output buffers PB1, NB1. INV1 and INV2 may be constituted by the inversion circuit shown in FIG. 20(*a*). The output buffers PB1, NB1 are formed in a large area so as to have low output impedances, and hence their input (gate) capacitances are large. The pre-buffers have the following role and configuration.

(1) The pre-buffers reduce the load capacitances of the level shift circuits LSU1, LSU2, and the setting of the design parameters of the level shift circuits is not restricted by the large input capacitances of the output buffers.

(2) The ON impedances of the PMOS transistors (e.g., PMOS transistors 300–303) on the cross-coupled side is set larger than that of the NMOS transistors (e.g., NMOS transistors 304, 305) on the input side, so that the previous output states of the level shift circuits LSU1, LSU2 can be inverted by the input signals I and /I. To directly drive the output buffer by reducing the impedance on the cross-coupled side, the impedance of the input MOS transistor must be further reduced, which is not advantageous in terms of the area occupied and the power consumption. Hence, the roles are so allocated that the level conversion function is performed by the level shift circuit and the output buffer is driven by the pre-buffer. When the input side has NMOS transistors, the output impedance of each circuit when outputting a logic "1" is so determined as to be increased, in ascending order, for the output buffer, the pre-buffer, and the level shift circuit. The output impedance of each circuit when outputting a logic "0" is determined in most cases in the same order. Considering the switching characteristics of the output buffer described later, the output impedance may be so determined as to be increased, in ascending order, for the output buffer, the level shift circuit, and the pre-buffer. Similarly, when the input side has PMOS transistors, the output impedance of each circuit when outputting a logic "0" is so determined as to be increased, in ascending order, for the output buffer, the pre-buffer, and the level shift circuit. Although the output impedance of each circuit when outputting a logic "1" is determined in the same order in most cases, the order of impedance may be changed to the ascending order of the output buffer, the level shift circuit, and the pre-buffer, considering the switching characteristics of the output buffer described later.

(3) When the output buffer shifts from the previous output state to the inverted state, the simultaneous turn-on of both MOS transistors should be avoided, or at least the period during which they both conduct should be short. That is, it is desirable that both MOS transistors be turned off relatively early and turned on relatively late. The waveform of the signal to be fed to the output terminal I/O is preferably made gradual to some degree because too steep a trailing or leading edge of the signal waveform is likely to induce differential noise in the surrounding external pins and in the wiring around the printed circuit board. Considering these points, the output impedances of the pre-buffers are determined.

MOS transistors N1 and P1, whose drains are connected to the input side of the pre-buffer, prevent a large through-current current caused by the simultaneous turn-on of the buffer MOS transistors PB1 and NB1, which can occur because the signal from the low-voltage power supply circuit is not defined when the power supply voltage Vddq is already established but the power supply voltage Vdd is not yet established (the power supply voltage turn-on sequence is so determined that Vddq is established earlier than Vdd), such as may occur when turning on the power supply for an applied system. P1 conducts when the gate voltage of PB1 is at a low level "L", and N1 conducts when the gate voltage of NB1 is at a high level "H". Assuming a normal operation, in the high output impedance mode when PB1 and NB1 are both off, N1 and P1 are also both off, thus exerting no influence on the normal operation. In the low output impedance mode when only one of PB1 and NB1 is on, the transistor N1 or P1 which is on acts to turn off the other that has been off, thus actually having no effect on the normal operation. In normal operation, PB1 and NB1 cannot both be on, and thus the input voltages of an abnormal state (that is, when the gate voltage of PB1 is low and the gate voltage of NB1 is high) are not supplied. When the signal from the low-voltage power supply circuit is undefined in the above case, such an abnormal state may occur. However, as the state approaches an abnormal state, N1 and P1 begin to conduct and act to change the gate voltages of PB1 and NB1 in the same direction, so that finally only one of PB1 and NB1 is turned on.

MOS transistors N2–N5 provide greater assurance that through-current will be prevented during power turn-on in the above case. When the power supply is turned on and accordingly the outputs Q and /Q of the level shift circuit LSU1 begin to rise, N3 starts to conduct, pulling the input /I toward the low level and the output Q toward the high level. Likewise, N2 also begins to conduct, pulling the output /Q toward the low level and the output Q toward the high level. That is, N2 and N3 both act to pull the output Q of the level shift circuit LSU1 toward the high level when the power supply is turned on. During the normal operation, when the input I is high, the output Q is high. At this time N2 and N3 act to move the output Q to the high level, i.e., in the same direction. Further, when the input I is low, N2 and N3 are off. Hence, N2 and N3 have no adverse effects on the logic operation of the outputs Q and /Q based on the inputs I and /I.

N4 and N5 operate in a way similar to N2 and N3, and thus their description will be omitted. The only difference is that the connection to the input and output terminals of the level shift circuit LSU is opposite to that of the level shift circuit LSU1, and hence the output Q is pulled to the low level at the time of power supply turn-on.

Because, at the time of power turn-on, N2–N5 pull the output Q of the LSU2 toward the low level and the output Q of LSU1 toward the high level, they both act to turn off the output buffers PB1 and NB1. Hence, if, at the time of power supply turn-on, N1 and P1 operate earlier, only one of the output buffers PB1 and NB1 is turned on. If N2–N5 operate earlier, both of the output buffers PEB and NB1 are turned off. In either case, the output buffers PB1 and NB1 can be prevented from turning on simultaneously.

N6 similarly pulls the output Q of the level shift circuit LSU3 to the high level when the power supply is turned on, thereby preventing the state of the input/output terminal I/O from being transmitted to the internal circuit /In. Moreover, N7 pulls the output Q of the level shift circuit LSU4 to the high level when the power supply is turned on, thus turning off the pull-up transistor P3.

One of N4 and N5 connected to LSU2 and one of N2 and N3 connected to LSU1 may be omitted as in LSU3, LSU4.

Figure 20A:
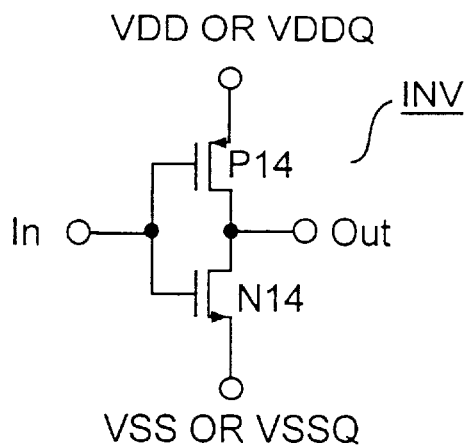
FIG. 20(a) shows an example of an INV used in the embodiment of FIG. 19.
Figure 20B:
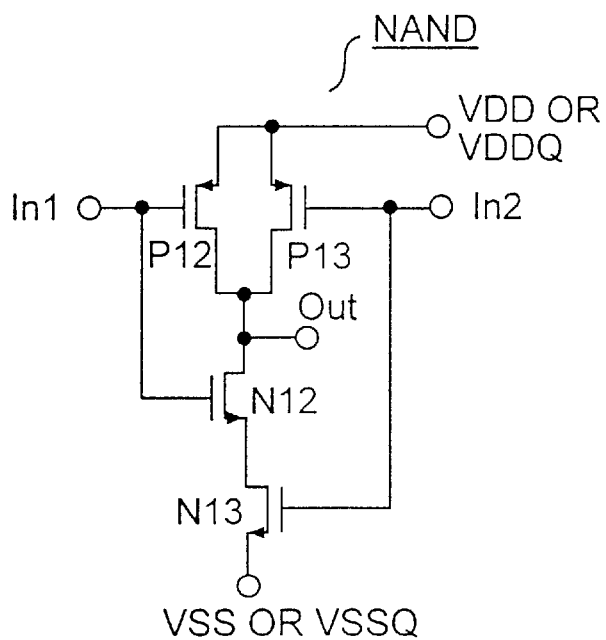
FIG. 20(b) shows an example of a NAND circuit used in the embodiment of FIG. 19.
Figure 20C:
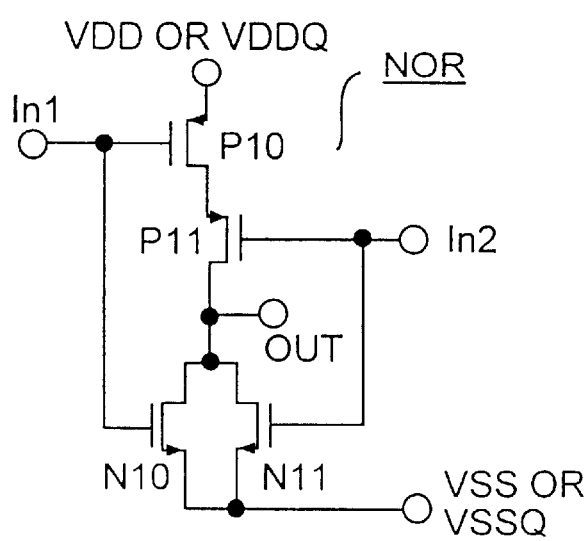
FIG. 20(c) shows an example of a NOR circuit used in the embodiment of FIG. 19.
Figure 20D:
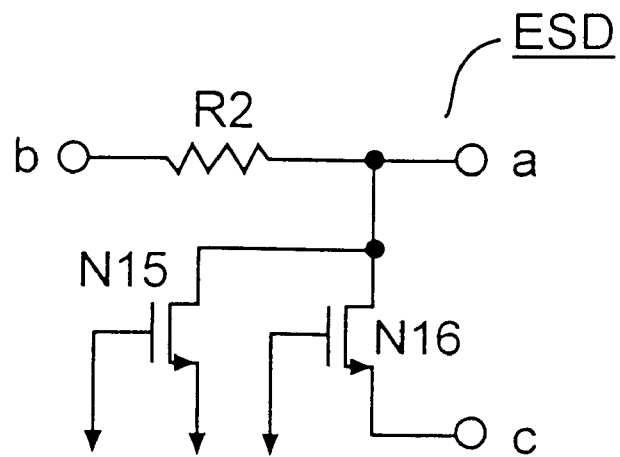
FIG. 20(d) shows an example of an electrostatic protective device used in the embodiment of FIG. 19.

ESD1 and ESD2 are electrostatic breakdown protective circuits as shown in FIG. 20(d), for example, which prevent the gate insulating layers of the output buffers PB1, NB1 from breaking down when a surge voltage enters the input/output terminal I/O.

Referring back to FIG. 19, a resistor R1 and MOS transistors P2 and N8 constitute a circuit for preventing the MOS gate insulating layer of the NOR gate NOR2 from breaking down when a surge voltage enters the input/output terminal I/O. Resistor R1 and MOS transistor N9 constitute a circuit to prevent the gate insulating layer of pull-up transistor P3 from breaking down when a surge voltage enters the input/output terminal I/O.

Figure 20E:
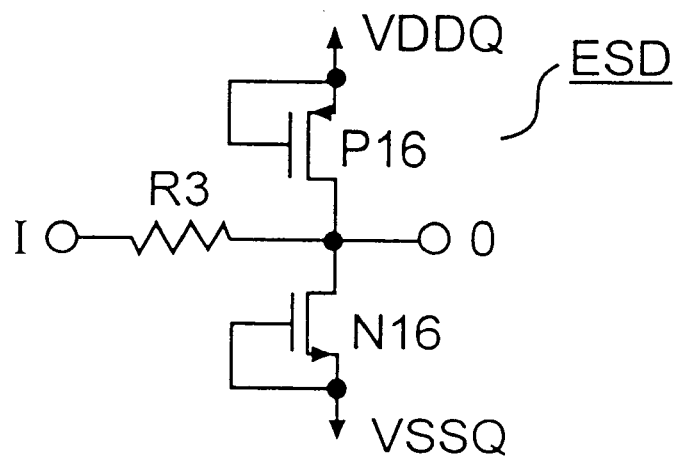
FIG. 20(e) shows an example of another electrostatic protective device used in the embodiment of FIG. 19.

ESD3–ESD10 are electrostatic breakdown protective circuits, and may be constructed as shown in FIG. 20(e). These circuits prevent the gate insulating layers of the level shift circuits LSU1–LSU4 from breaking down when a surge voltage enters between different power supplies Vdd and Vddq, between Vdd and Vssq, between Vss and Vddq, or between Vss and Vssq (Vss and Vssq are typically connected on the printed circuit board when the IC is mounted on the board but are open when the IC is handled as a single device, where there is a particular need for measures against surges), and flows through the low-voltage power supply load circuit on the left side and the high-voltage power supply load circuit on the right side of FIG. 19. In the circuit of FIG. 20(*e*), a resistor R3 relaxes the waveform of a surge voltage at I in cooperation with the parasitic capacitor, and also produces a voltage drop when a bypass current flows through a protective device N16 or P16, thereby limiting the surge voltage impressed on the output terminal O connected to the MOS gates of the level shift circuit LSU1–LSU4. When a surge makes the potential of the node I is more positive than the power supply Vddq, the source junction (PN junction) of P16 connected to the node I side is biased forwardly to form a surge bypass between the node I and the power supply Vddq through the N substrate (N well) connected to the junction and the power supply Vddq. When a surge renders the node I more negative than the power supply Vddq, the drain junction (PN junction) of P16 connected to the node I side breaks down in the reverse direction to form a surge bypass between the node I and the power supply Vddq through the N substrate (N well) (or further through the source junction on the opposite side) connected to the junction and the power supply Vddq. The gate of P16 is connected to the power supply Vddq, so that the electric field concentration is large in the drain junction, lowering the absolute value of the breakdown voltage.

When a surge voltage is impressed between the node I and the power supply Vssq, N16 forms a bypass between the node I and the power supply Vssq in a positive-negative relation, contrarily to the case described above.

In the normal operation, the above drain junction between P16 and N16 on the side of the node I is not biased forwardly, nor is it applied with a reverse bias over the breakdown voltage. Further, P16 and N16 have their gates and sources short-circuited and therefore are off. Hence, the protective circuits do not affect the normal logic operation.

The electrostatic breakdown protective devices described above are provided in the high-voltage power supply circuit block enclosed of FIG. 19. The gate insulation layers are formed thick to prevent the protective devices themselves from breaking down.

Figure 21:
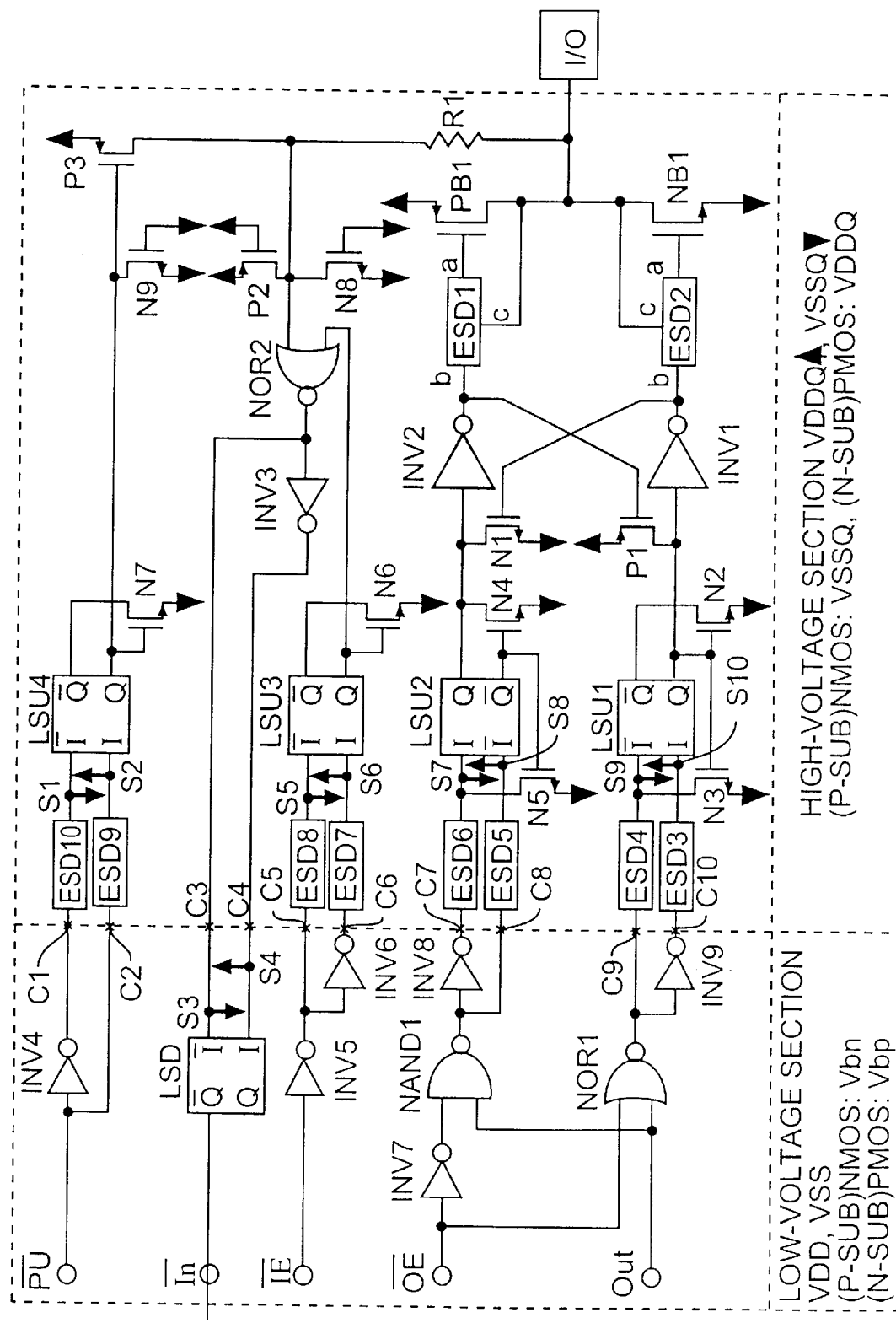
FIG. 21 shows an example of an input/output circuit that renders unnecessary circuit portions of FIG. 19 that are substantially inoperable.

The input/output circuit shown in FIG. 19 is preferably arranged as a standard circuit around bonding pads of multiple chips. According to the use and kind of the IC, the input/output terminal I/O may be used for input only or output only, or for both input and output. Unnecessary input/output circuits can be made substantially inoperable by the embodiment shown in FIG. 21. C1–C10 denote "broken line" points for rendering a particular circuit of the high-voltage power supply inoperable by not providing the wiring between the low-voltage power supply circuit and the high-voltage power supply circuit. S1–S10 shows that inputs are fixed to a particular logic with low impedance when the input paths are cut off in such a form. S1–S10 are connected to Vssq (down arrow) or Vddq (up arrow) via the internal wiring of the IC. When the terminal I/O is used, for example, as an input-only terminal, the lines are cut off at points C7–C10 (no wiring pattern is provided) and the inputs I and /I of the level shift circuits LSU1, LSU2 are connected to the power supplies as shown to render both the output buffers PB1 and NB1 off. With the inputs of the level shift circuits fixed to a particular logic level, the buffers do not perform switching, thus preventing erroneous operation and waste of electric power. By fixing the inputs of the preceding stage circuits as much as possible, it is possible to eliminate the need for additional complexity of the circuits of the succeeding stage.

Figure 22A:
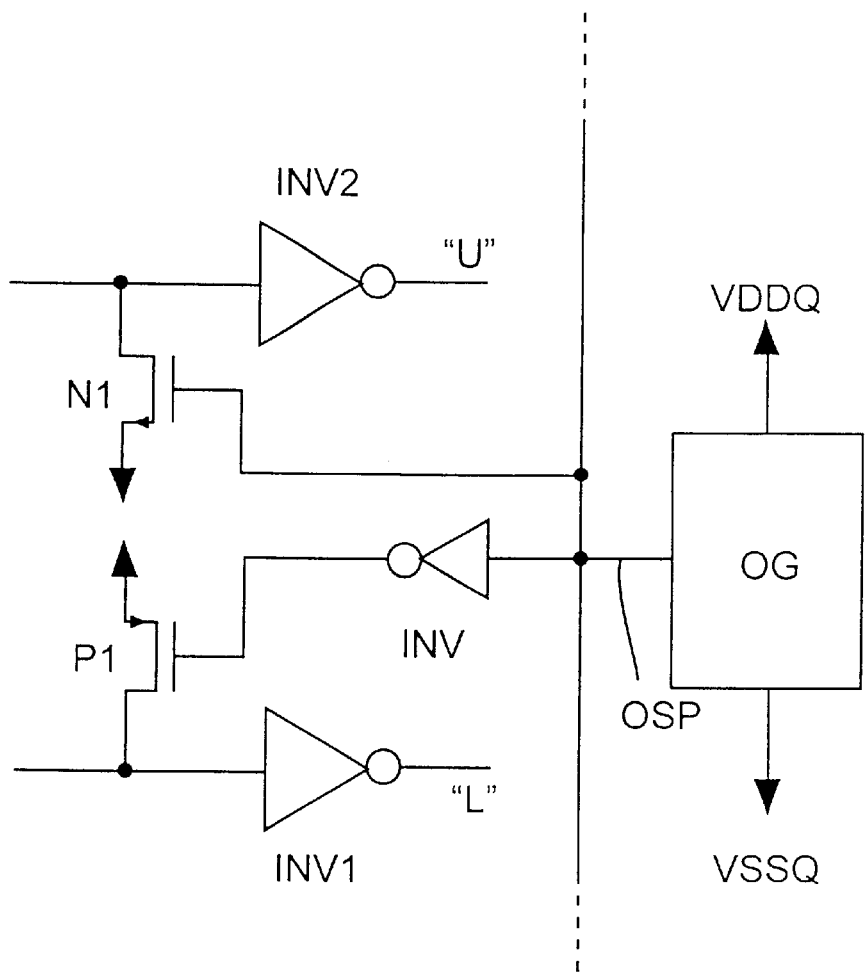
FIGS. 22(a) and 22(b) respectively show a further embodiment of the circuit for preventing a through-current from flowing through the output buffers PB1 and NB1 at the time of power supply turn-on, and an operation waveform therefor.
Figure 22B:
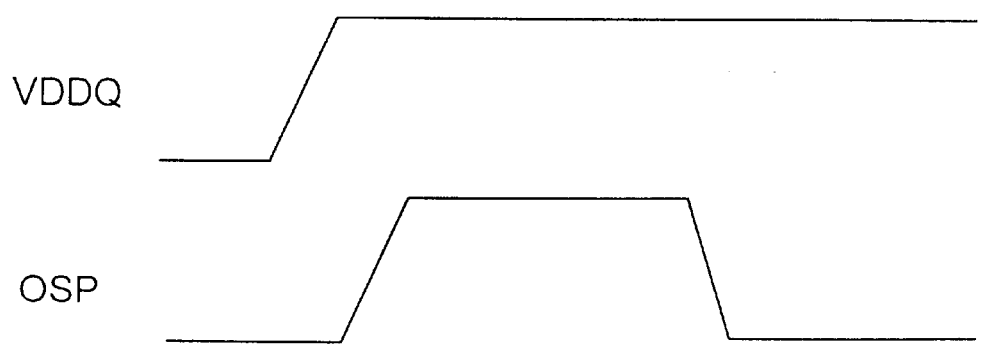

FIG. 22(*a*) shows another embodiment of a circuit for preventing a through-current that may flow through the output buffers PB1 and NB1 at the time of power supply turn-on. In the figure, parts identical with corresponding parts of FIG. 19 are designated by like reference symbols. Symbol OG denotes a one-shot pulse generation circuit that generates pulses OSP for a particular period of time after the power supply Vddq is turned on, as illustrated in FIG. 22(*b*). After the power supply turn-on, this pulse OSP turns on MOS transistors N1 and P1, bringing the outputs of the inverters INVL and INV2 to a low level and a high level, respectively, and turning off both the output buffers PB1 and NB1 at the succeeding stage. Connecting this one-shot pulse generation circuit OG commonly to the similar portions of other input/output circuits (through buffers) enables compact integration of the input/output circuits and also makes it possible to set the initial state of the level shift circuits LSU1–LSU4 at the time of power supply turn-on.

Figure 23:
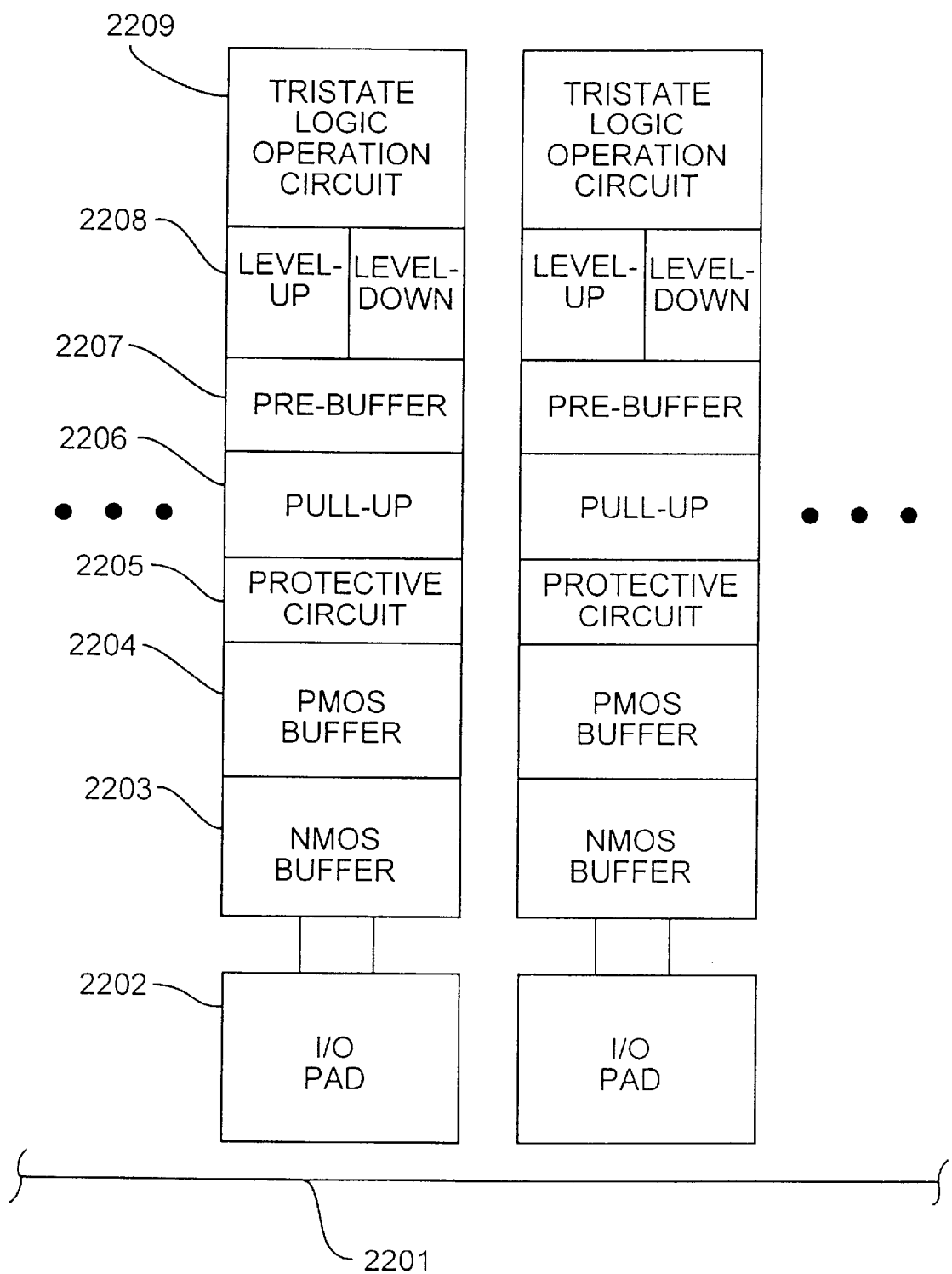
FIG. 23 shows an example of the layout of the input/output circuit of FIG. 19.

FIG. 23 shows one preferred embodiment of the layout of the input/output circuit shown in FIG. 19.

As shown in FIG. 23, a plurality of I/O pads 2202 are arranged in parallel along a chip end portion 2201. Circuits shown in FIG. 19 are arranged near the chip end side in a direction perpendicular to the chip end side. NMOS buffer 2203 and PMOS buffer 2204 are the MOS transistors NB1 and PB1 of the output buffers of FIG. 19 and arranged by the side of the I/O pads as shown. Arranged toward the inside of the chip are the electrostatic breakdown protective circuit ESD1 and ESD2 (2205), the pull-up circuit (2206), the pre-buffer (2207), the level shift circuit (2208), and the tristate logic operation circuit (2209).

Power supply wiring is laid on third and fourth metallic wiring layers to extend between the adjoining circuit blocks in a direction parallel to the chip end side. Vssq and Vddq are wired on 2203, Vssq and Vddq on 2204, Vssq on 2205, Vddq on 2206, Vssq on 2207, Vddq on 2208, and Vss and Vdd on 2209.

Next, the configuration of an inter-power supply protective device will be described that can suitably be applied to a chip that, like the semiconductor integrated circuit device of this invention, uses a plurality of power supply voltages. The semiconductor integrated circuit device of this embodiment employs, in particular, a triple well construction. A particularly efficient configuration of the inter-power supply protective device of the triple well construction will be described in the following.

In chips that use a plurality of power supplies of different voltages (or even power supplies of the same voltage provided separately, depending on the magnitude of power supply noise), there are several kinds of power supply pins. To allow static electricity to escape easily and thereby improve the electrostatic dielectric strength in such chips, it is effective to insert such devices as MOS transistors and diodes between power supplies and ground and between different power supplies. In this case, connections should be made so that no current flows in the forward direction under a bias present in the normal use condition, but also so that a current flows in the reverse direction only when static electricity of several hundred to several thousand volts enters the chip.

In the case of a triple well structure, a diode can be fabricated in four different ways: between a P-type substrate and an N-type element region, between an N-type element region and a P-type well, between a P-type well and an N-type diffusion layer, and between an N-type well and a P-type diffusion layer. The method by which the area is minimized and the parasitic element effect is small depends on the kind of power supply to be connected to it.

A particularly efficient configuration of such a protective device of the embodiment of this invention will be described below.

Figure 24A:
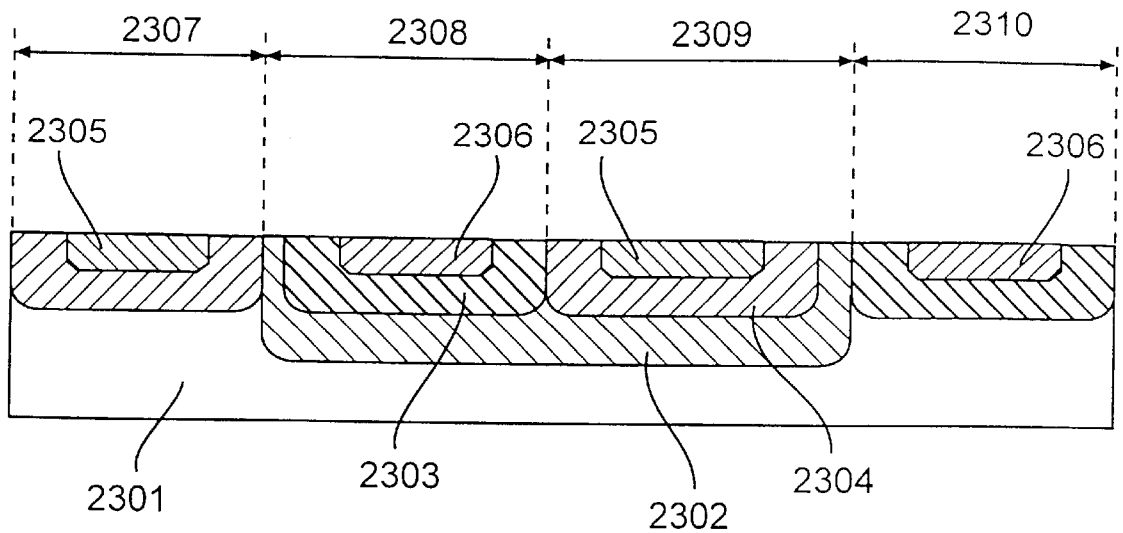
FIG. 24 shows an example of the configuration of an inter-power supply protective device.
Figure 24B:
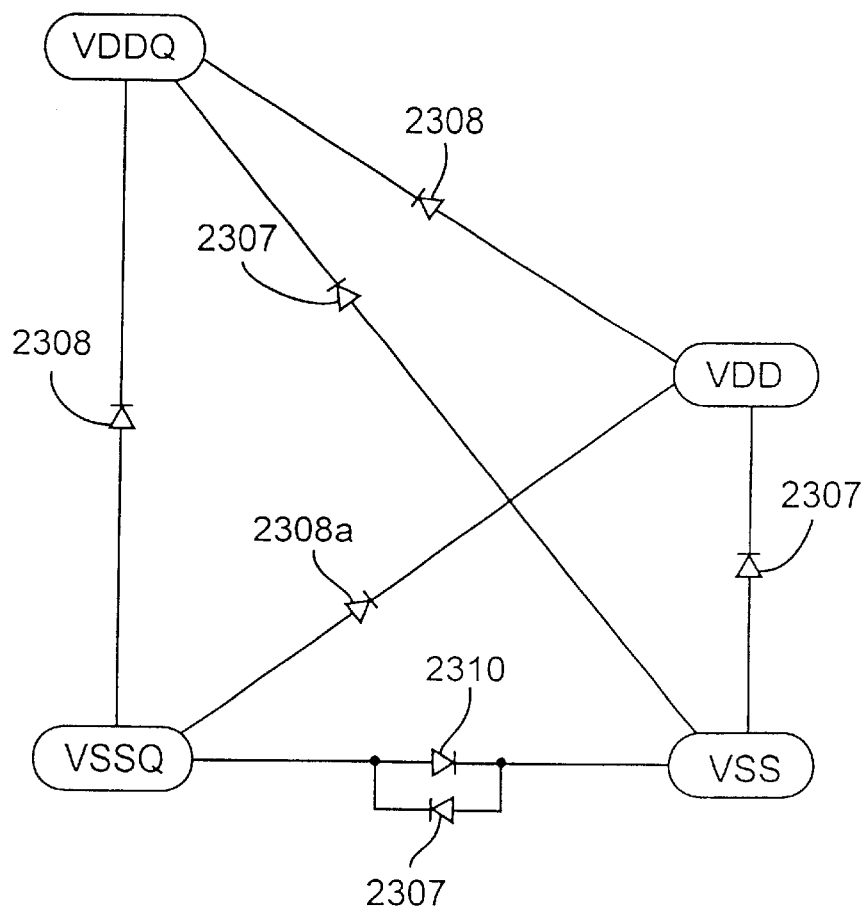

FIG. 24(a) shows an example of a particularly efficient way of forming a diode when the diode connections shown in FIG. 24(b) are made in a chip having a P-type silicon substrate and supplied with VSS.

FIG. 24(a) shows a silicon substrate (P-type) 2301, an element formation region (N-type) 2302, an N-type well 2303, a P-type well 2304, an N-type diffusion layer 2305, a P-type diffusion layer 2306, a diode 2307 formed by a P-type well formed on the P-type substrate and the N-type diffusion layer 2305, a diode 2308 formed by the N-type well 2303 formed on the N-type device formation region 2302 (biased by VDDQ) and the P-type diffusion layer 2306, a diode 2308a formed by the N-type well 2303 formed on the N-type device formation region 2302 (biased by VDD) and the P-type diffusion layer 2306, a diode 2309 formed by the P-type well 2304 formed on the N-type device formation region 2302 and the N-type diffusion layer 2305, and a diode 2310 formed by an N-type well formed on the P-type substrate 2301 and the P-type diffusion layer 2306.

In the case of a chip where the silicon substrate is of P-type and supplied with VSS, first, the diode connected to VSS is desirably formed directly on the P-type substrate by using the P-type well, the same conductivity type as that of the substrate, without using the N-type element formation region. The diode thus formed has a minimal area, eliminates parasitic element operation, and can also feed VSS to the P-type substrate.

Second, the diode connected to VDDQ is desirably formed on the N-type device element region by using the N-type well. The diode thus formed has a minimal area, eliminates parasitic element operation, and can also feed VDDQ to the N-type element formation region.

Third, a diode other than the above two kinds of diode is desirably formed directly on the P-type substrate by using the N-type well without forming any N-type element formation region. The diode thus formed has a minimal area and eliminates parasitic element operation.

Figure 25A:
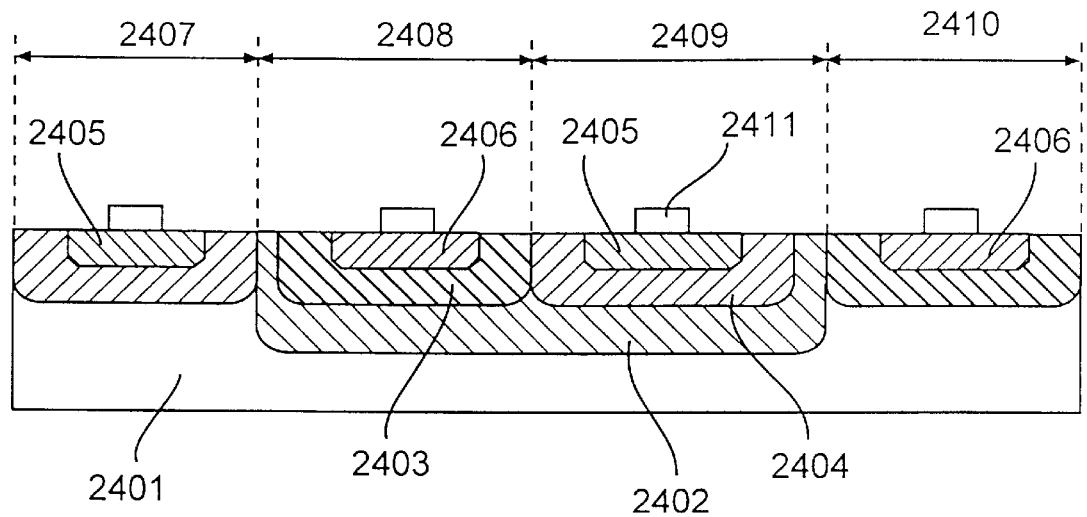
FIG. 25 shows another example of the configuration of an inter-power supply protective device.
Figure 25B:
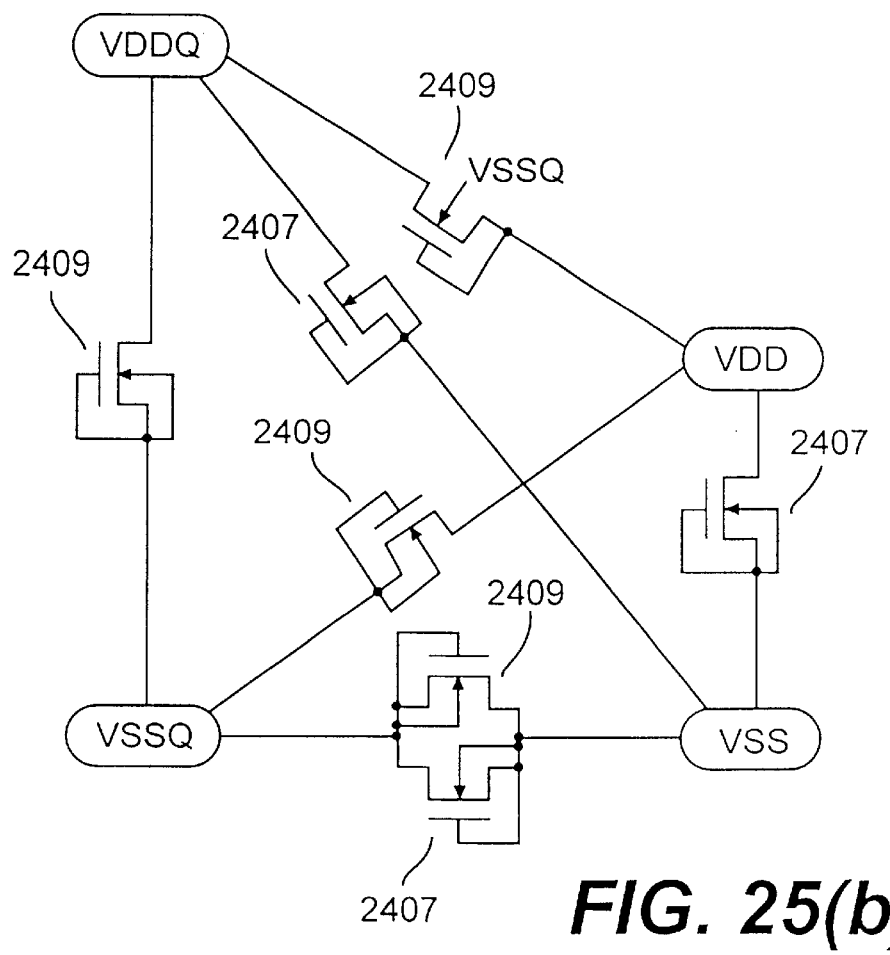
Figure 25C:
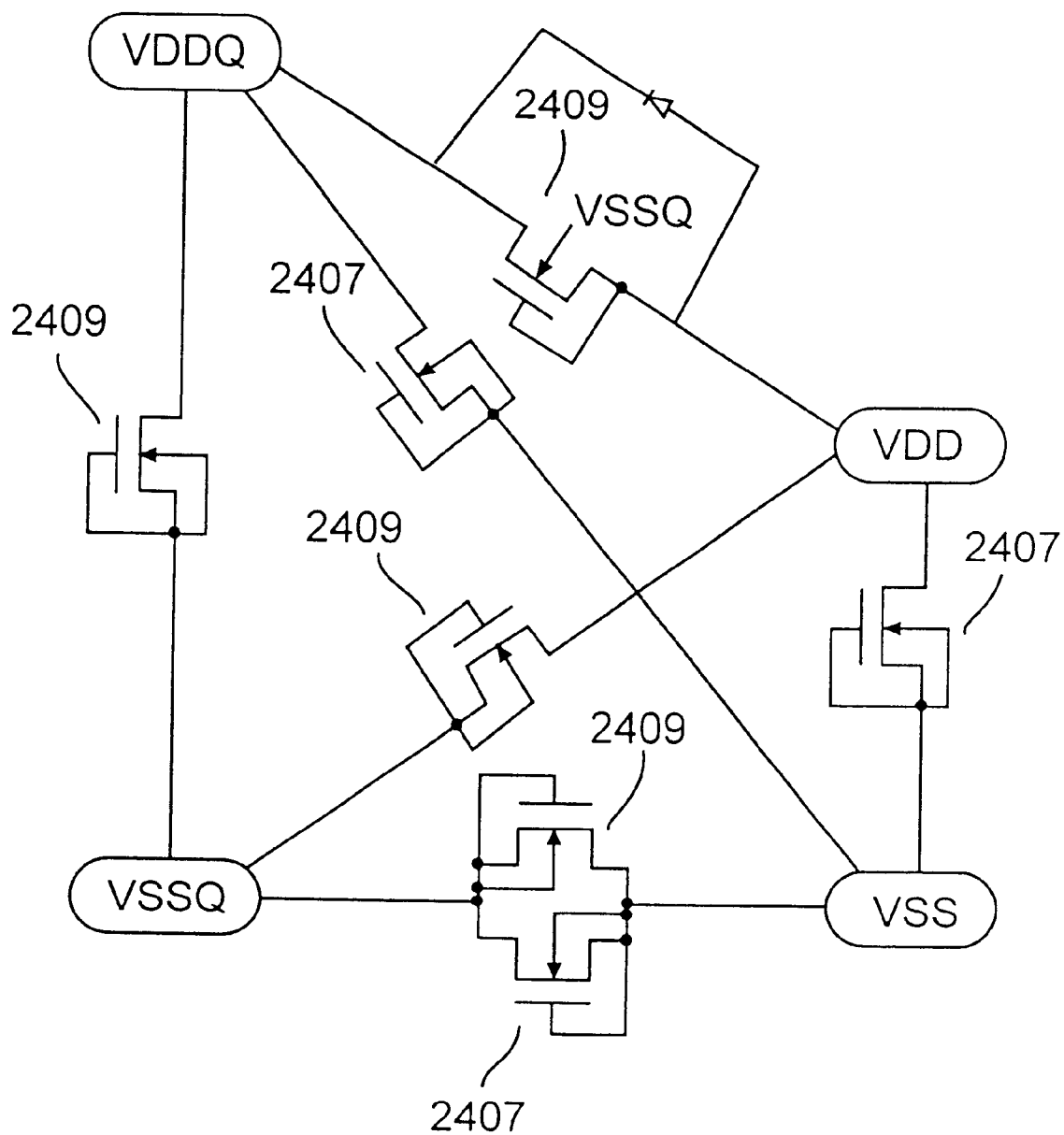

FIGS. 25(a), 25(b), and 25(c) show further examples of the inter-power supply protective device of this embodiment.

FIG. 25(a) shows an example of a particularly efficient way of forming a MOS transistor when the MOS transistor connections as shown in FIG. 25(b) are made in a chip having a P-type silicon substrate and supplied with VSS. FIG. 25(c) shows a modification of the circuit of FIG. 25(a).

FIG. 25(a) shows a silicon substrate (P-type) 2401, an element formation region (N-type) 2402, an N-type well 2403, a P-type well 2404, an N-type diffusion layer 2405, a P-type diffusion layer 2406, a gate 2411, an N-channel MOS transistor 2407 on a P-type well formed on the P-type substrate, a P-channel MOS transistor 2408 on the N-type well 2403 formed on the N-type element formation region 2402 (biased by VDDQ), an N-channel MOS transistor 2409 on the P-type well 2404 formed on the N-type element formation region 2402 (biased by VDDQ), and a P-channel MOS transistor 2410 on an N-type well formed on the P-type substrate 2401.

In the case of a chip where the silicon substrate is of P-type and supplied with VSS, first, the N-channel MOS transistor connected to VSS, because it has the well of the same P-type as the substrate, is desirably formed directly on the P-type substrate without forming any N-type element formation region. The N-channel MOS transistor thus formed has a minimal area, eliminates parasitic element operation, and can also feed VSS to the P-type substrate.

Second, the N-channel MOS transistor connected to VSSQ, though it has a P-type well, is desirably formed on the N-type element formation region biased by VDDQ. Thus, VSSQ can be fed to the P-type well of this N-channel MOS transistor and be electrically isolated from the P-type substrate supplied with VSS, thereby eliminating parasitic element operation.

Third, an N-channel MOS transistor other than the above two kinds of N-channel MOS transistors, although they have a P-type well, is formed on the N-type element formation region biased by VDD or VDDQ. Thus, VSSQ can be fed to the P-type well of this N-channel MOS transistor and electrically isolated from the P-type substrate supplied with VSS, eliminating parasitic element operation.

Various modifications of the invention as set forth in the foregoing description will become apparent to those of ordinary skill in the art. All such modifiations that basically rely on the teachings through which the invention has advanced the state of the art are properly considered within the spirit and scope of the invention.

We claim:

1. A level-down level conversion circuit, comprising:
   first and second field-effect transistors respectively arranged to receive complementary input signals of a first amplitude; and
   third and fourth field-effect transistors of polarity opposite to that of the first and second field-effect transistors;
   wherein the sources of the first and second field-effect transistors are coupled to a first voltage level, the sources of the third and fourth field-effect transistors are coupled to a second voltage level, the drain of the first field-effect transistor is coupled to the gate of the fourth field-effect transistor, and the drain of the second field-effect transistor and the gate of the third field-effect transistor are coupled to an output node of the level-down level conversion circuit; and
   wherein the third and fourth field-effect transistors have thinner oxide layers than those of the first and second field-effect transistors.

2. A level-down level conversion circuit as claimed in claim 1, wherein the ground level of said complementary input signals fluctuates more than the threshold voltages of said first and second field-effect transistors.

3. A level-down level conversion circuit, comprising:
   a first NMOS transistor receiving one of a pair of differential input signals at a gate thereof and having a source connected to a first voltage;
   a second NMOS transistor receiving the other of said pair of differential input signals at a gate thereof and having a source connected to the first voltage;
   a first PMOS transistor having a source connected to a second voltage, a drain connected to a drain of the first NMOS transistor, and a gate connected to the drain of the second NMOS transistor; and
   a second PMOS transistor having a source connected to the second voltage, a drain connected to the drain of the second NMOS transistor, and a gate connected to the drain of the first NMOS transistor;
   wherein the first and second PMOS transistors have thinner oxide layers than those of the first and second NMOS transistors.

4. A level-down level conversion circuit according to claim 3, wherein the first and second PMOS transistors have gate oxide layers that are thinner than gate oxide layers of the first and second NMOS transistors.

5. A level-down level conversion circuit as claimed in claim 3, further comprising an inverter coupled to the drain of the second NMOS transistor.

6. In a semiconductor integrated circuit device having a plurality of circuit blocks, at least two of said circuit blocks having different respective operating voltages, the improvement comprising a level-down level conversion circuit for converting the level of a signal received from a high-voltage circuit block for supply to a low-voltage circuit block;

wherein said level-down level conversion circuit includes:

first and second field-effect transistors respectively arranged to receive complementary input signals of a first amplitude; and third and fourth field-effect transistors of polarity opposite to that of the first and second field-effect transistors;

wherein the sources of the first and second field-effect transistors are coupled to a first voltage level, the sources of the third and fourth field-effect transistors are coupled to a second voltage level, the drain of the first field-effect transistor is coupled to the gate of the fourth field-effect transistor, and the drain of the second field-effect transistor and the gate of the third field-effect transistor are coupled to an output node of the level-down level conversion circuit;

wherein the third and fourth field-effect transistors have thinner oxide layers than those of the first and second field-effect transistors.

7. A level-up level conversion circuit, comprising:

first and second field-effect transistors arranged to receive complementary input signals of a first amplitude, wherein the sources of the first and second field-effect transistors are coupled to a first voltage level;

third and fourth field-effect transistors arranged to receive said complementary input signals of said first amplitude, the first and second field-effect transistors being of opposite polarity to that of the third and fourth field-effect transistors, wherein the drains of the third and fourth field-effect transistors are respectively coupled to the drains of the first and second field-effect transistors;

fifth and sixth field-effect transistors, the fifth and sixth field-effect transistors being of opposite polarity to that of the first and second field-effect transistors, wherein the gate of the fifth field-effect transistor is coupled to the drain of the fourth field-effect transistor and to an output node of the level conversion circuit, the gate of the sixth field-effect transistor is coupled to the drain of the third field-effect transistor, and the sources of the third and fourth field-effect transistors are respectively coupled to the drains of the fifth and sixth field-effect transistors; and a seventh field-effect transistor having a source connected to a second voltage level, a gate connected to ground, and a drain connected to the sources of the fifth and sixth field-effect transistors.

8. A level-up level conversion circuit, comprising:

a first NMOS transistor receiving one of a pair of differential input signals at a gate thereof and having a source connected to a first voltage;

a second NMOS transistor receiving the other of said pair of differential input signals at a gate thereof and having a source connected to the first voltage;

a first PMOS transistor receiving said one of said pair of differential input signals at a gate thereof and having a drain connected to the drain of the first NMOS transistor;

a second PMOS transistor receiving said other of said pair of differential input signals at a gate thereof and having a drain connected to the drain of the second NMOS transistor;

third and fourth PMOS transistors respectively having drains connected to the sources of said first and second PMOS transistors; and a fifth PMOS transistor having a source connected to a second voltage, a gate connected to ground, and a drain connected to the sources of said third and fourth PMOS transistors, wherein the drain of the first NMOS transistor is coupled to the gate of the fourth PMOS transistor and the drain of the second NMOS transistor is coupled to the gate of the third PMOS transistor.

9. A level-up level conversion circuit as claimed in claim 8, further comprising an inverter coupled to the drain of the second NMOS transistor.

10. A level-up level conversion circuit, comprising:

first and second NMOS transistors having respective sources coupled to a first voltage;

a first PMOS transistor having a drain coupled to the drains of the first and second NMOS transistors;

a second PMOS transistor having a drain coupled to the source of the first PMOS transistor;

wherein the gates of said first NMOS transistor and said second PMOS transistor are arranged to receive one of a first pair of complementary input signals, and wherein the gates of the second NMOS transistor and the first PMOS transistor are arranged to receive one of a second pair of complementary input signals;

third and fourth PMOS transistors;

a third NMOS transistor having a drain coupled to the drains of the third and fourth PMOS transistors;

a fourth NMOS transistor having a drain coupled to the source of the third NMOS transistor and a source coupled to the first voltage;

wherein the gates of the third PMOS transistor and the third NMOS transistor are arranged to receive the other of the first pair of complementary input signals, and wherein the gates of the fourth PMOS transistor and the fourth NMOS transistor are arranged to receive the other of the second pair of complementary input signals;

a fifth PMOS transistor having a source coupled to a second voltage, a gate coupled to the drains of the third and fourth PMOS transistors, and a drain coupled to the source of the second PMOS transistor; and a sixth PMOS transistor having a source coupled to the second voltage, a gate coupled to the drains of the first and second NMOS transistors, and a drain coupled to the sources of the third and fourth PMOS transistors.

11. A level-up level conversion circuit as claimed in claim 10, further comprising an inverter coupled to the drain of the third NMOS transistor.

12. A level-up level conversion circuit, comprising:

a NOR circuit arranged to receive at least two input signals;

a NAND circuit arranged to receive the complements of said at least two input signals; and means functionally coupling said NOR circuit and said NAND circuit such that said level-up level conversion circuit provides an output signal that is the logical OR of said at least two input signals, said output signal having an amplitude that is larger than that of said at least two input signals when any of said at least two input signals becomes high.

13. A level-up level conversion circuit, comprising:
a first logic circuit arranged to receive at least two input signals;
a second logic circuit arranged to receive the complements of said at least two input signals, wherein said second logic circuit is a complementary circuit of said first logic circuit; and
means functionally coupling said first logic circuit and said second logic circuit such that said level-up level conversion circuit performs the inverse of the logical operation performed by said first logic circuit on said at least two input signals, said output signal having an amplitude that is larger than that of said at least two input signals when any of said at least two input signals becomes high.

14. A level conversion circuit, comprising:
first and second NMOS transistors having respective sources coupled to a first voltage;
a first PMOS transistor having a drain coupled to the drains of the first and second NMOS transistors;
a second PMOS transistor having a drain coupled to the source of the first PMOS transistor;
wherein the gates of said first NMOS transistor and said second PMOS transistor are arranged to receive one of a first pair of complementary input signals, and wherein the gates of the second NMOS transistor and the first PMOS transistor are arranged to receive one of a second pair of complementary input signals;
third and fourth PMOS transistors;
a third NMOS transistor having a drain coupled to the drains of the third and fourth PMOS transistors;
a fourth NMOS transistor having a drain coupled to the source of the third NMOS transistor and a source coupled to the first voltage;
wherein the gates of the third PMOS transistor and the third NMOS transistor are arranged to receive the other of the first pair of complementary input signals, and wherein the gates of the fourth PMOS transistor and the fourth NMOS transistor are arranged to receive the other of the second pair of complementary input signals;
a fifth PMOS transistor having a source coupled to a second voltage, a gate coupled to the drains of the third and fourth PMOS transistors, and a drain coupled to the source of the second PMOS transistor;
a sixth PMOS transistor having a source coupled to the second voltage, a gate coupled to the drains of the first and second NMOS transistors, and a drain coupled to the sources of the third and fourth PMOS transistors; and
an inverter arranged to receive said one of the second pair of complementary input signals and to output said other of the second pair of complementary input signals to the gates of the fourth PMOS transistor and the fourth NMOS transistor.

15. A level conversion circuit as claimed in claim 14, wherein when said one of the second pair of complementary input signals is low, the output of the level conversion circuit is always high.

16. A level conversion circuit as claimed in claim 14, wherein when said one of the second pair of complementary input signals is low, no through-current flows from said second voltage to said first voltage.

17. A level conversion circuit as claimed in claim 14, wherein the second NMOS transistor, the second PMOS transistor, the fourth NMOS transistor, and the fourth PMOS transistor have gate lengths that are smaller than the gate lengths of the first NMOS transistor, the first PMOS transistor, the third NMOS transistor, and the third PMOS transistor.

18. A level conversion circuit as claimed in claim 14, wherein when said one of the second pair of complementary input signals is high, the output of the level conversion circuit is always low.

19. A level conversion circuit, comprising:
a first NMOS transistor arranged to receive a first input signal on a gate thereof;
a second NMOS transistor arranged to receive the complement of said first input signal on a gate thereof;
a first PMOS transistor arranged to receive said first input signal on a gate thereof, said first PMOS transistor having a drain coupled to the drain of said first NMOS transistor;
a second PMOS transistor arranged to receive said complement of said first input signal on a gate thereof, said second PMOS transistor having a drain coupled to the drain of said second NMOS transistor;
a third PMOS transistor having a source connected to a first voltage, a gate connected to the drains of said second NMOS transistor and second PMOS transistor, and a drain connected to the source of said first PMOS transistor;
a fourth PMOS transistor having a source connected to said first voltage, a gate connected to the drains of said first NMOS transistor and said first PMOS transistor, and a drain connected to the source of said second PMOS transistor;
a third NMOS transistor having a source coupled to a second voltage, a gate arranged to receive a second input signal, and a drain connected to the sources of the first and second NMOS transistors; and
a fifth PMOS transistor having a source coupled to said first voltage, a gate connected to the gate of said third NMOS transistor, and a drain connected to the drains of said second NMOS transistor and said second PMOS transistor.

20. A level conversion circuit, comprising:
a first NMOS transistor having a source coupled to a a first voltage, and a gate arranged to receive a first input signal;
a second NMOS transistor having a source coupled to said first voltage, and a gate arranged to receive the complement of said first input signal;
a first PMOS transistor arranged to receive said first input signal on a gate thereof, said first PMOS transistor having a drain coupled to the drain of said first NMOS transistor;
a second PMOS transistor arranged to receive said complement of said first input signal on a gate thereof, said second PMOS transistor having a drain coupled to the drain of said second NMOS transistor;
a third PMOS transistor having a gate connected to the drains of said second NMOS transistor and second PMOS transistor, and a drain connected to the source of said first PMOS transistor;

a fourth PMOS transistor having a gate-connected to the drains of said first NMOS transistor and said first PMOS transistor, and a drain connected to the source of said second PMOS transistor;

a fifth PMOS transistor having a source coupled to a second voltage, a gate arranged to receive a second input signal, and a drain connected to the sources of the third and fourth PMOS transistors; and a third NMOS transistor having a source connected to ground, a gate connected to the gate of said fifth PMOS transistor, and a drain connected to the drains of said second NMOS transistor and said second PMOS transistor.

21. A circuit block, comprising:

a level conversion circuit including:

first and second NMOS transistors having respective sources coupled to a first voltage;

a first PMOS transistor having a drain coupled to the drains of the first and second NMOS transistors;

a second PMOS transistor having a drain coupled to the source of the first PMOS transistor;

wherein the gates of said first NMOS transistor and said second PMOS transistor are arranged to receive one of a first pair of complementary input signals, and wherein the gates of the second NMOS transistor and the first PMOS transistor are arranged to receive one of a second pair of complementary input signals;

third and fourth PMOS transistors;

a third NMOS transistor having a drain coupled to the drains of the third and fourth PMOS transistors;

a fourth NMOS transistor having a drain coupled to the source of the third NMOS transistor and a source coupled to the first voltage;

wherein the gates of the third PMOS transistor and the third NMOS transistor are arranged to receive the other of the first pair of complementary input signals, and wherein the gates of the fourth PMOS transistor and the fourth NMOS transistor are arranged to receive the other of the second pair of complementary input signals;

a fifth PMOS transistor having a source coupled to a second voltage, a gate coupled to the drains of the third and fourth PMOS transistors, and a drain coupled to the source of the second PMOS transistor;

a sixth PMOS transistor having a source coupled to the second voltage, a gate coupled to the drains of the first and second NMOS transistors, and a drain coupled to the sources of the third and fourth PMOS transistors; and an inverter arranged to receive said one of the second pair of complementary input signals and to output said other of the second pair of complementary input signals to the gates of the fourth PMOS transistor and the fourth NMOS transistor; and a latch arranged to receive and hold the output level of the level conversion circuit.

22. A circuit block as claimed in claim 21, wherein when said one of the second pair of complementary input signals is low, the output of the level conversion circuit is always high.

23. A circuit block as claimed in claim 21, wherein when said one of the second pair of complementary input signals is low, no through-current flows from said second voltage to said first voltage.

24. A circuit block as claimed in claim 21, wherein the second NMOS transistor, the second PMOS transistor, the fourth NMOS transistor, and the fourth PMOS transistor have gate lengths that are smaller than the gate lengths of the first NMOS transistor, the first PMOS transistor, the third NMOS transistor, and the third PMOS transistor.

25. A circuit block as claimed in claim 21 wherein when said one of the second pair of complementary input signals is high, the output of the level conversion circuit is always low.

26. A circuit block, comprising:

a level conversion circuit including:

a first NMOS transistor arranged to receive a first input signal on a gate thereof;

a second NMOS transistor arranged to receive the complement of said first input signal on a gate thereof;

a first PMOS transistor arranged to receive said first input signal on a gate thereof, said first PMOS transistor having a drain coupled to the drain of said first NMOS transistor;

a second PMOS transistor arranged to receive said complement of said first input signal on a gate thereof, said second PMOS transistor having a drain coupled to the drain of said second NMOS transistor;

a third PMOS transistor having a source connected to a first voltage, a gate connected to the drains of said second NMOS transistor and second PMOS transistor, and a drain connected to the source of said first PMOS transistor;

a fourth PMOS transistor having a source connected to said first voltage, a gate connected to the drains of said first NMOS transistor and said first PMOS transistor, and a drain connected to the source of said second PMOS transistor;

a third NMOS transistor having a source coupled to a second voltage, a gate arranged to receive a second input signal, and a drain connected to the sources of the first and second NMOS transistors; and a fifth PMOS transistor having a source coupled to said first voltage, a gate connected to the gate of said third NMOS transistor, and a drain connected to the drains of said second NMOS transistor and said second PMOS transistor; and a latch arranged to receive and hold the output level of the level conversion circuit.

27. A circuit block, comprising: a level conversion circuit including:

a first NMOS transistor having a source coupled to a first voltage, and a gate arranged to receive a first input signal;

a second NMOS transistor having a source coupled to said first voltage, and a gate arranged to receive the complement of said first input signal;

a first PMOS transistor arranged to receive said first input signal on a gate thereof, said first PMOS transistor having a drain coupled to the drain of said first NMOS transistor;

a second PMOS transistor arranged to receive said complement of said first input signal on a gate thereof, said second PMOS transistor having a drain coupled to the drain of said second NMOS transistor;

a third PMOS transistor having a gate connected to the drains of said second NMOS transistor and second PMOS transistor, and a drain connected to the source of said first PMOS transistor;

a fourth PMOS transistor having a gate connected to the drains of said first NMOS transistor and said first PMOS transistor, and a drain connected to the source of said second PMOS transistor;

a fifth PMOS transistor having a source coupled to a second voltage, a gate arranged to receive a second input signal, and a drain connected to the sources of the third and fourth PMOS transistors; and a third NMOS transistor having a source connected to ground, a gate connected to the gate of said fifth PMOS transistor, and a drain connected to the drains of said second NMOS transistor and said second PMOS transistor; and a latch arranged to receive and hold the output level of the level conversion circuit.

28. In a semiconductor integrated circuit device having a plurality of circuit blocks, at least two of said circuit blocks having different respective operating voltages, the improvement comprising a level-up level conversion circuit for converting the level of a signal received from a low-voltage circuit block for supply to a high-voltage circuit block;

wherein said level-up level conversion circuit includes:
first and second NMOS transistors having respective sources coupled to a first voltage;
a first PMOS transistor having a drain coupled to the drains of the first and second NMOS transistors;
a second PMOS transistor having a drain coupled to the source of the first PMOS transistor;
wherein the gates of said first NMOS transistor and said second PMOS transistor are arranged to receive one of a first pair of complementary input signals, and wherein the gates of the second NMOS transistor and the first PMOS transistor are arranged to receive one of a second pair of complementary input signals;
third and fourth PMOS transistors;
a third NMOS transistor having a drain coupled to the drains of the third and fourth PMOS transistors;
a fourth NMOS transistor having a drain coupled to the source of the third NMOS transistor and a source coupled to the first voltage;
wherein the gates of the third PMOS transistor and the third NMOS transistor are arranged to receive the other of the first pair of complementary input signals, and wherein the gates of the fourth PMOS transistor and the fourth NMOS transistor are arranged to receive the other of the second pair of complementary input signals;
a fifth PMOS transistor having a source coupled to a second voltage, a gate coupled to the drains of the third and fourth PMOS transistors, and a drain coupled to the source of the second PMOS transistor;
a sixth PMOS transistor having a source coupled to the second voltage, a gate coupled to the drains of the first and second NMOS transistors, and a drain coupled to the sources of the third and fourth PMOS transistors; and
an inverter arranged to receive said one of the second pair of complementary input signals and to output said other of the second pair of complementary input signals to the gates of the fourth PMOS transistor and the fourth NMOS transistor.

29. A semiconductor integrated circuit device as claimed in claim 28, wherein when said one of the second pair of complementary input signals is low, the output of the level conversion circuit is always high.

30. A semiconductor integrated circuit device as claimed in claim 28, wherein when said one of the second pair of complementary input signals is low, no through-current flows from said second voltage to said first voltage.

31. A semiconductor integrated circuit device as claimed in claim 28, wherein the second NMOS transistor, the second PMOS transistor, the fourth NMOS transistor, and the fourth PMOS transistor have gate lengths that are smaller than the gate lengths of the first NMOS transistor, the first PMOS transistor, the third NMOS transistor, and the third PMOS transistor.

32. A semiconductor integrated circuit device as claimed in claim 28, wherein when said one of the second pair of complementary input signals is high, the output of the level conversion circuit is always low.

33. In a semiconductor integrated circuit device having a plurality of circuit blocks, at least two of said circuit blocks having different respective operating voltages, the improvement comprising one of said circuit blocks having a level-up level conversion circuit for converting the level of a signal received from a low-voltage circuit block for supply to a high-voltage circuit block, and a latch arranged to receive and hold the output level of the level-up level conversion circuit;

wherein said level-up level conversion circuit includes:
a first NMOS transistor arranged to receive a first input signal on a gate thereof;
a second NMOS transistor arranged to receive the complement of said first input signal on a gate thereof;
a first PMOS transistor arranged to receive said first input signal on a gate thereof, said first PMOS transistor having a drain coupled to the drain of said first NMOS transistor;
a second PMOS transistor arranged to receive said complement of said first input signal on a gate thereof, said second PMOS transistor having a drain coupled to the drain of said second NMOS transistor;
a third PMOS transistor having a source connected to a first voltage, a gate connected to the drains of said second NMOS transistor and second PMOS transistor, and a drain connected to the source of said first PMOS transistor;
a fourth PMOS transistor having a source connected to said first voltage, a gate connected to the drains of said first NMOS transistor and said first PMOS transistor, and a drain connected to the source of said second PMOS transistor;
a third NMOS transistor having a source coupled to a second voltage, a gate arranged to receive a second input signal, and a drain connected to the sources of the first and second NMOS transistors; and
a fifth PMOS transistor having a source coupled to said first voltage, a gate connected to the gate of said third NMOS transistor, and a drain connected to the drains of said second NMOS transistor and said second PMOS transistor.

34. In a semiconductor integrated circuit device having a plurality of circuit blocks, at least two of said circuit blocks having different respective operating voltages, the improvement comprising one of said circuit blocks having a level-up level conversion circuit for converting the level of a signal received from a low-voltage circuit block for supply to a high-voltage circuit block, and a latch arranged to receive and hold t he output level of the level-up level conversion circuit;

wherein said level-up level conversion circuit includes:
a first NMOS transistor having a source coupled to a first voltage, and a gate arranged to receive a first input signal;
a second NMOS transistor having a source coupled to said first voltage, and a gate arranged to receive the complement of said first input signal;

a first PMOS transistor arranged to receive said first input signal on a gate thereof, said first PMOS transistor having a drain coupled to the drain of said first NMOS transistor;

a second PMOS transistor arranged to receive said complement of said first input signal on a gate thereof, said second PMOS transistor having a drain coupled to the drain of said second NMOS transistor;

a third PMOS transistor having a gate connected to the drains of said second NMOS transistor and second PMOS transistor, and a drain connected to the source of said first PMOS transistor;

a fourth PMOS transistor having a gate connected to the drains of said first NMOS transistor and said first PMOS transistor, and a drain connected to the source of said second PMOS transistor;

a fifth PMOS transistor having a source coupled to a second voltage, a gate arranged to receive a second input signal, and a drain connected to the sources of the third and fourth PMOS transistors; and a third NMOS transistor having a source connected to ground, a gate connected to the gate of said fifth PMOS transistor, and a drain connected to the drains of said second NMOS transistor and said second PMOS transistor.

* * * * *